United States Patent
Kono et al.

(10) Patent No.: US 11,755,270 B2
(45) Date of Patent: Sep. 12, 2023

(54) DISPLAY DEVICE WITH A DETECTION ELECTRODE

(71) Applicant: Japan Display Inc., Tokyo (JP)

(72) Inventors: Takaaki Kono, Tokyo (JP); Yoshio Owaki, Tokyo (JP); Makoto Hayashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/727,076

(22) Filed: Apr. 22, 2022

(65) Prior Publication Data

US 2022/0253267 A1 Aug. 11, 2022

Related U.S. Application Data

(63) Continuation of application No. PCT/JP2020/037271, filed on Sep. 30, 2020.

(30) Foreign Application Priority Data

Oct. 24, 2019 (JP) ................. 2019-193282

(51) Int. Cl.
*G06F 3/14* (2006.01)
*G02F 1/1333* (2006.01)
(Continued)

(52) U.S. Cl.
CPC .......... *G06F 3/1423* (2013.01); *G02F 1/1334* (2013.01); *G02F 1/13338* (2013.01);
(Continued)

(58) Field of Classification Search
CPC .... G06F 3/1423; G06F 3/0488; G06F 1/1643; G06F 3/04184; G06F 3/04166;
(Continued)

(56) References Cited

U.S. PATENT DOCUMENTS

2006/0132332 A1  6/2006  Ono
2007/0291015 A1  12/2007  Mori
(Continued)

FOREIGN PATENT DOCUMENTS

JP  2006178590 A  7/2006
JP  2007334827 A  12/2007
(Continued)

OTHER PUBLICATIONS

International Search Report of corresponding PCT application PCT/JP2020/037271, dated Nov. 10, 2020.

*Primary Examiner* — David D Davis
(74) *Attorney, Agent, or Firm* — K&L Gates LLP

(57) ABSTRACT

An object of the present disclosure is to provide a technique capable of displaying an appropriate display image corresponding to a position of an observer. A display device includes a detection electrode, a first screen, and a second screen on a side opposite to the first screen. A distance between the detection electrode and the first screen is longer than a distance between the detection electrode and the second screen, or a dielectric constant between the detection electrode and the first screen is lower than a dielectric constant between the detection electrode and the second screen, or the distance between the detection electrode and the first screen is longer than the distance between the detection electrode and the second screen and the dielectric constant between the detection electrode and the first screen is lower than the dielectric constant between the detection electrode and the second screen.

8 Claims, 19 Drawing Sheets

(51) Int. Cl.
*G02F 1/1334* (2006.01)
*G06F 3/0488* (2022.01)
*H10K 59/40* (2023.01)
*H10K 59/128* (2023.01)

(52) U.S. Cl.
CPC ...... *G02F 1/133342* (2021.01); *G06F 3/0488* (2013.01); *H10K 59/128* (2023.02); *H10K 59/40* (2023.02)

(58) Field of Classification Search
CPC ........... G06F 3/041662; G06F 3/04186; G06F 3/0443; G06F 3/0445; G06F 3/0446; G06F 3/0412; G02F 1/133342; G02F 1/13338; G02F 1/1334; H10K 59/128; H10K 59/40; G09G 3/2092; G09G 2300/023; G09G 2300/0426; G09G 2354/00; G09F 9/00; G09F 9/30
See application file for complete search history.

(56) References Cited

U.S. PATENT DOCUMENTS

| | | |
|---|---|---|
| 2013/0265284 A1 | 10/2013 | Yun et al. |
| 2014/0009415 A1 | 1/2014 | Nishida |
| 2017/0205913 A1* | 7/2017 | Kimura ................. G06F 3/0412 |
| 2017/0220163 A1* | 8/2017 | Kurasawa ........... G06F 3/04166 |
| 2017/0371464 A1 | 12/2017 | Nakanishi |
| 2020/0034021 A1 | 1/2020 | Mori |

FOREIGN PATENT DOCUMENTS

| | | | |
|---|---|---|---|
| JP | 2012221007 A | | 11/2012 |
| JP | 2014029673 A | | 2/2014 |
| JP | 2015512549 A | | 4/2015 |
| JP | 2017161986 A | * | 9/2017 |
| JP | 2017161986 A | | 9/2017 |
| JP | 2018004733 A | | 1/2018 |
| WO | 2019069728 A1 | | 4/2019 |

* cited by examiner

DISPLAY DEVICE WITH A DETECTION ELECTRODE

CLAIM OF PRIORITY

The present application is a continuation application of International Application No. PCT/JP2020/037271, filed on Sep. 30, 2020, which claims priority to Japanese Patent Application No. 2019-193282, filed on Oct. 24, 2019. The contents of these applications are incorporated herein by reference in their entirety.

BACKGROUND OF THE INVENTION

The present disclosure relates to a display device and is particularly applicable to a transparent display device having a touch detection function.

A display device is known, which enables a scenery behind a display screen to be visually recognized through the display screen while displaying an image on the display screen. This display screen is also called a transparent display. There are a proposal to attach a touch panel to the transparent display and a proposal to add a touch sensor function to the transparent display (see Japanese Unexamined Patent Application Publication No. 2007-334827, Japanese Unexamined Patent Application Publication No. 2018-4733, Japanese Unexamined Patent Application Publication No. 2014-29673, and the like).

SUMMARY OF THE INVENTION

However, the transparent display is transmissive. Therefore, when an observer (user) views a display image displayed on the first screen side of the transparent display from the second screen side (opposite side) opposite to the first screen, the display image inverted by 180 degrees is viewed.

An object of the present disclosure is to provide a technique capable of displaying an appropriate display image corresponding to the position of an observer.

Other objects and new features will be clarified from the description of the present specification and the accompanying drawings.

A representative overview of the present invention is briefly described as follows.

That is, a display device according to an aspect includes a detection electrode, a first screen, and a second screen present on a side opposite to the first screen. A distance between the detection electrode and the first screen is longer than a distance between the detection electrode and the second screen, or a dielectric constant between the detection electrode and the first screen is lower than a dielectric constant between the detection electrode and the second screen, or the distance between the detection electrode and the first screen is longer than the distance between the detection electrode and the second screen, and the dielectric constant between the detection electrode and the first screen is lower than the dielectric constant between the detection electrode and the second screen.

DETAILED DESCRIPTION OF THE PREFERRED EMBODIMENTS

Hereinafter, each embodiment of the present invention is described with reference to the accompanying drawings.

The present disclosure is merely an example, those skilled in the art will be able to easily conceive of changes as appropriate while maintaining the gist of the present invention, and the changes are naturally included in the scope of the present invention. In addition, in order to clarify the explanation, the drawings may schematically represent the width, thickness, shape, and the like of each part as compared with the actual forms, but the drawings are merely examples and do not limit the interpretation of the present invention.

In addition, in the present specification and each drawing, elements that are the same as or similar to those described with respect to the abovementioned drawings may be denoted by the same reference signs, and detailed descriptions thereof may be omitted as appropriate.

The present embodiment discloses a liquid crystal display device as an example of a display device. This liquid crystal display device can be used for various devices such as a bulletin board, an information board, an in-vehicle device, and a game machine, for example.

In the present specification and the claims, expressions such as "upper" and "lower" in explaining the drawings represent a relative positional relationship between a target structure and another structure. Specifically, a direction from a first substrate (array substrate) to a second substrate (opposite substrate) is defined as "upper" and the opposite direction is defined as "lower" as viewed from the side.

The "display device" refers to all display devices, each of which displays an image using a display panel. The "display panel" refers to a structure for displaying an image using an electro-optic layer. For example, the term "display panel" may refer to a display cell including an electro-optic layer or may refer to a structure in which another optical member (for example, a polarizing member, a backlight, a touch panel, or the like) is attached to a display cell. In this case, the "electro-optic layer" may include a liquid crystal layer such as a polymer dispersed liquid crystal layer (PDLC layer), an electrochromic (EC) layer, organic EL, a micro-LED, and the like, unless there is a technical contradiction. Therefore, in the embodiment described later, a liquid crystal panel including a liquid crystal layer is described as a display panel, but this does not exclude the application to display panels including the other electro-optic layers described above.

Embodiment

Example of Entire Configuration of Display Device

Figure 1:
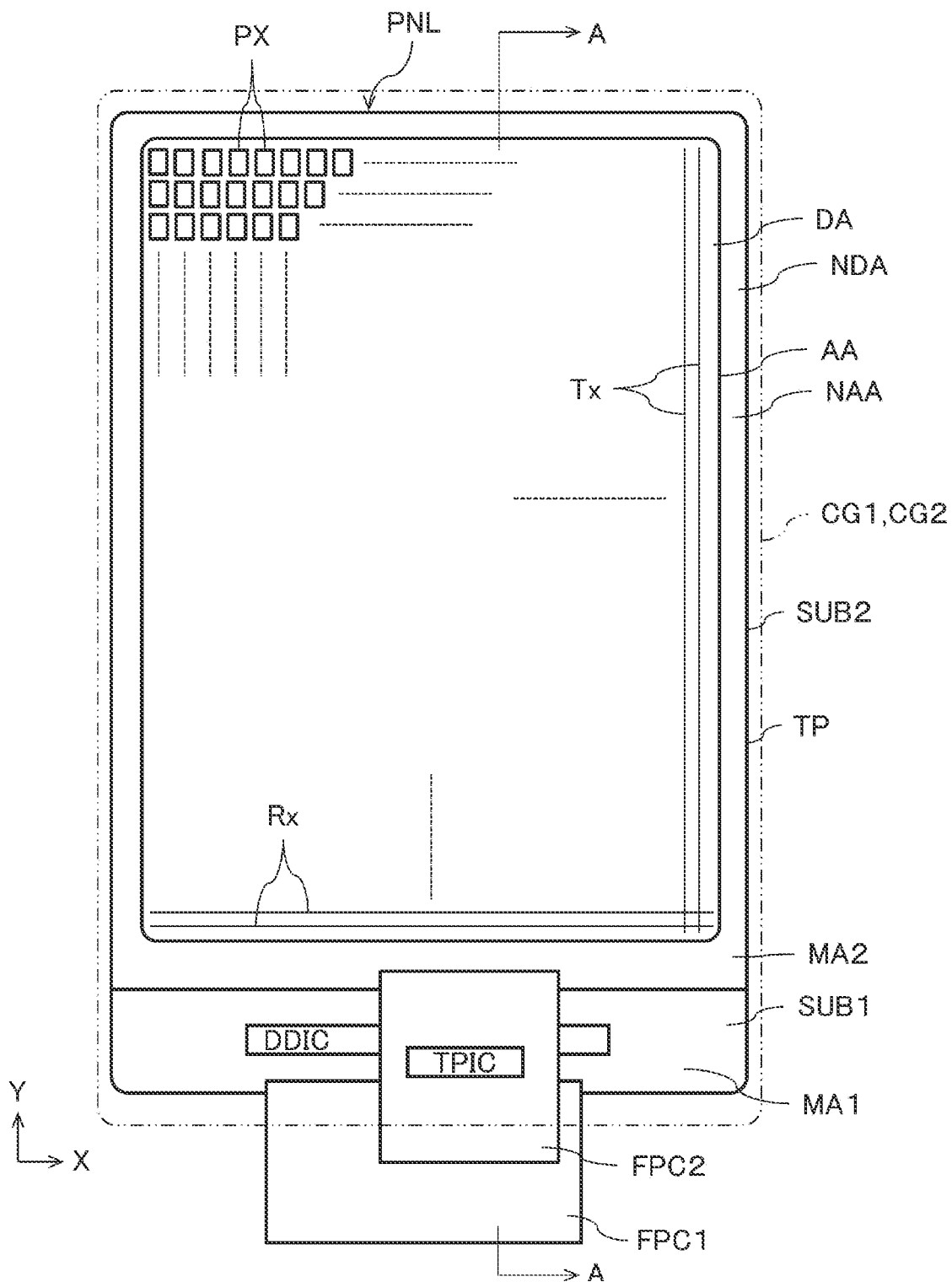
FIG. 1 is a plan view conceptually illustrating the exterior of a display device according to an embodiment.

FIG. 1 is a plan view conceptually illustrating the exterior of a display device according to the embodiment. As illustrated in FIG. 1, the display device DSP is a transparent display and includes cover glass CG1, cover glass CG2, a display panel PNL, a touch panel TP, a flexible printed circuit board FPC1, a display drive IC chip DDIC, a flexible printed circuit board FPC2, and a touch sensor IC chip TPIC.

The display panel PNL includes a first substrate (also referred to as an array substrate) SUB1, a second substrate (also referred to as an opposite substrate) SUB2, a liquid crystal layer LC described later, and a sealing member SE described later. The second substrate SUB2 is arranged facing the first substrate SUB1. The first substrate SUB1 includes a mounting portion MA1 extending more in a second direction Y than the second substrate SUB2. The sealing member SE is positioned in a non-display portion NDA, adheres to the first substrate SUB1 and the second substrate SUB2, and seals the liquid crystal layer LC.

As the liquid crystal layer LC, polymer dispersed liquid crystal (PDLC) can be used in this example. The PDLC has a certain material that becomes a non-transparent white state or a scattered state when a voltage is not applied to the PDLC, and becomes a transparent state when a voltage is applied to the PDLC. The PDLC has another material that becomes a transparent state when a voltage is not applied to the PDLC, and becomes a non-transparent white state or a scattered state when a voltage is applied to the PDLC. Therefore, the display panel PNL can be configured as a transparent display.

The display panel PNL includes a display portion (display region) DA in which an image is displayed and a frame-shaped non-display portion (non-display region, peripheral region) NDA surrounding the display portion DA. The display portion DA includes a plurality of pixels PX arranged in a matrix form in a first direction X and a second direction Y intersecting the first direction X.

The touch panel TP includes a sensor active region (hereinafter referred to as an active region) AA disposed overlapping the display portion DA for displaying an image, and a frame-shaped non-active region NAA surrounding the active region AA. The active region AA includes a plurality of detection electrodes Rx extending in the first direction X and arranged in the second direction Y intersecting the first direction X, and a plurality of drive electrodes Tx extending in the second direction Y and arranged in the first direction X intersecting the second direction Y.

One end of the flexible printed circuit board FPC1 is connected to the mounting portion MA1, while the other end of the flexible printed circuit board FPC1 is connected to a printed circuit board (not illustrated) on which a host device is mounted. In this example, the display drive IC chip DDIC is mounted on the mounting portion MA1 of the display panel PNL. The display drive IC chip DDIC may be mounted on the flexible printed circuit board FPC1. The display drive IC chip DDIC outputs, to the display panel PNL, a signal necessary to display an image in a display mode for displaying an image.

One end of the flexible printed circuit board FPC2 is connected to a mounting portion MA2 of the touch panel TP. In this example, the touch sensor IC chip TPIC is mounted on the flexible printed circuit board FPC2. The touch sensor IC chip TPIC may be mounted on the mounting portion MA2 of the touch panel TP. The touch sensor IC chip TPIC outputs, to the touch panel TP, a drive signal necessary for detection and receives a detection signal from the touch panel TP in a sensor mode.

The cover glass CG1 is disposed on the upper side of the touch panel TP and covers the touch panel TP. The cover glass CG2 is disposed on the lower side of the display panel PNL and covers the display panel PNL. The display panel PNL and the touch panel TP are disposed between and sandwiched by the cover glass CG1 and the cover glass CG2. As an example, the cover glass CG1 and the cover glass CG2 are made of a material such as transparent glass and have the same dielectric constant. Each of the cover glass CG1 and the cover glass CG2 may be constituted by a film made of a transparent resin material.

Although FIG. 1 illustrates a configuration example of the display device DSP having the touch panel TP on the display panel PNL, the display device DSP is not limited thereto. A display panel PNL having a touch detection function therein may be used in the display device DSP. The display panel PNL having the touch detection function therein is referred to as an in-cell type display panel PNL.

Sectional Configuration Example of Display Device

Figure 2A:
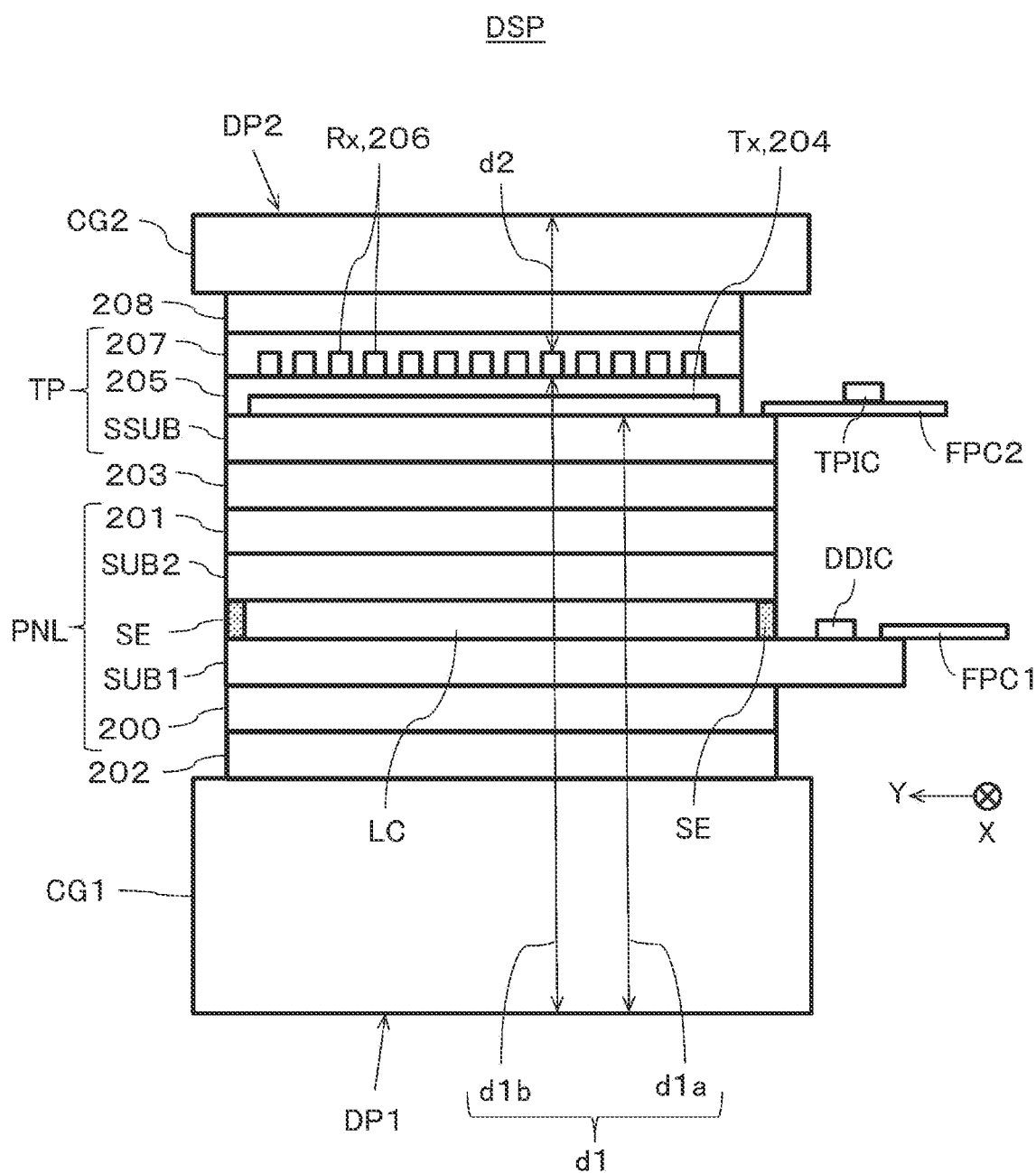
FIG. 2A is a diagram conceptually illustrating a sectional view of the display device, taken along a line A-A illustrated in FIG. 1.

FIG. 2A is a diagram conceptually illustrating a sectional view of the display device, taken along a line A-A illustrated in FIG. 1. A lower polarizing plate 200 is attached to and disposed under the first substrate SUB1, while an upper polarizing plate 201 is attached to and disposed on the second substrate SUB2. The sealing member SE is positioned in the non-display portion NDA, adheres the first substrate SUB1 and the second substrate SUB2, and seals the liquid crystal layer LC. The cover glass CG1 is attached to the lower polarizing plate 200 via an adhesive layer 202 and disposed under the lower polarizing plate 200 on the back screen side of the display panel PNL. A combination of the first substrate SUB1, the second substrate SUB2, the lower polarizing plate 200, the upper polarizing plate 201, the sealing member SE, and the liquid crystal layer LC is referred to as the display panel PNL. A transparent display in which a PDLC layer is used as a liquid crystal layer LC is switched between a transparent state and a scattered state. When the transparent display that is switched between the transparent state and the scattered state is used, the upper polarizing plate 201 and the lower polarizing plate 200 can be removed.

A back surface of the sensor substrate SSUB is attached to the upper polarizing plate 201 via the adhesive layer 203 and disposed above the upper polarizing plate 201. On the sensor substrate SSUB, the plurality of drive electrodes Tx constituted by a first metal wiring layer 204 are disposed and a first insulating film 205 is disposed and covers the plurality of drive electrodes Tx. On the first insulating film 205, the plurality of detection electrodes Rx constituted by a second metal wiring layer 206 are disposed and a second insulating film 207 is disposed and covers the plurality of detection electrodes Rx. The cover glass CG2 is disposed on the second insulating film 207 and attached to the second insulating film 207 via an adhesive layer 208. A combination of the sensor substrate SSUB, the drive electrodes Tx, the first insulating film 205, the detection electrodes Rx, and the second insulating film 207 is referred to as the touch panel TP.

The first metal wiring layer 204 and the second metal wiring layer 206 can be made of a transparent conductive material such as an indium tin oxide (ITO) or an indium zinc oxide (IZO). Each of the first insulating film 205 and the second insulating film 207 can be constituted by an organic insulating film made of an organic insulating material such as acrylic resin. The second insulating film 207 can be constituted by an inorganic insulating film made of an inorganic insulating material such as a silicon oxide, a silicon nitride, or a silicon oxynitride.

As illustrated in FIG. 2A, in this example, a lower surface of the cover glass CG1 is defined as a first screen (first surface or first side) DP1 of the display device DSP as the transparent display and an upper surface of the cover glass CG2 is defined as a second screen (second surface or first side) DP2 of the display device DSP as the transparent display. The first screen DP1 can be referred to as a first touch screen, and the second screen DP2 can be referred to as a second touch screen.

As methods for detecting that an external proximity object such as a finger of an observer or user or a pen touches the touch panel TP or is present near the touch panel TP, there are a mutual detection method and a self-detection method as described later. In the mutual detection method, when the touch is detected, each of the plurality of drive electrodes Tx is sequentially driven (scanned) by a drive pulse at predetermined intervals and a detected pulse is obtained from each of the plurality of detection electrodes Rx. A two-dimensional position and coordinates of the external proximity object on a flat surface of the touch panel TP are detected based on times when the electrodes are driven by the drive pulse and times when the detected pulses are output. On the other hand, in the self-detection method, each of the plurality of detection electrodes Rx and the plurality of drive electrodes Tx is sequentially driven (scanned) by a self-detection drive pulse at predetermined intervals and a two-dimensional position and coordinates of the external proximity object on the flat surface of the touch panel TP are detected. When the touch is detected in the self-detection method, the plurality of detection electrodes Rx and the plurality of drive electrodes Tx can be treated as detection electrodes.

Therefore, when the detection method of the touch panel TP is the mutual detection method, a distance $d1b$ between the first screen DP1 and each of the detection electrode Rx is longer than a distance d2 between the second screen DP2 and each of the detection electrode Rx ($d1b>d2$). In addition, when the detection method of the touch panel TP is the self-detection method, the drive electrodes Tx are detection electrodes and a distance $d1a$ between the first screen DP1 and each of the drive electrodes Tx as the detection electrodes is longer than the distance d2 between the second screen DP2 and each of the detection electrodes Rx ($d1a>d2$). That is, a distance d1 between the first screen DP1 and each of the drive electrodes is either the distance $d1a$ or the distance $d1b$ based on the detection method of the touch panel TP.

Figure 2B:
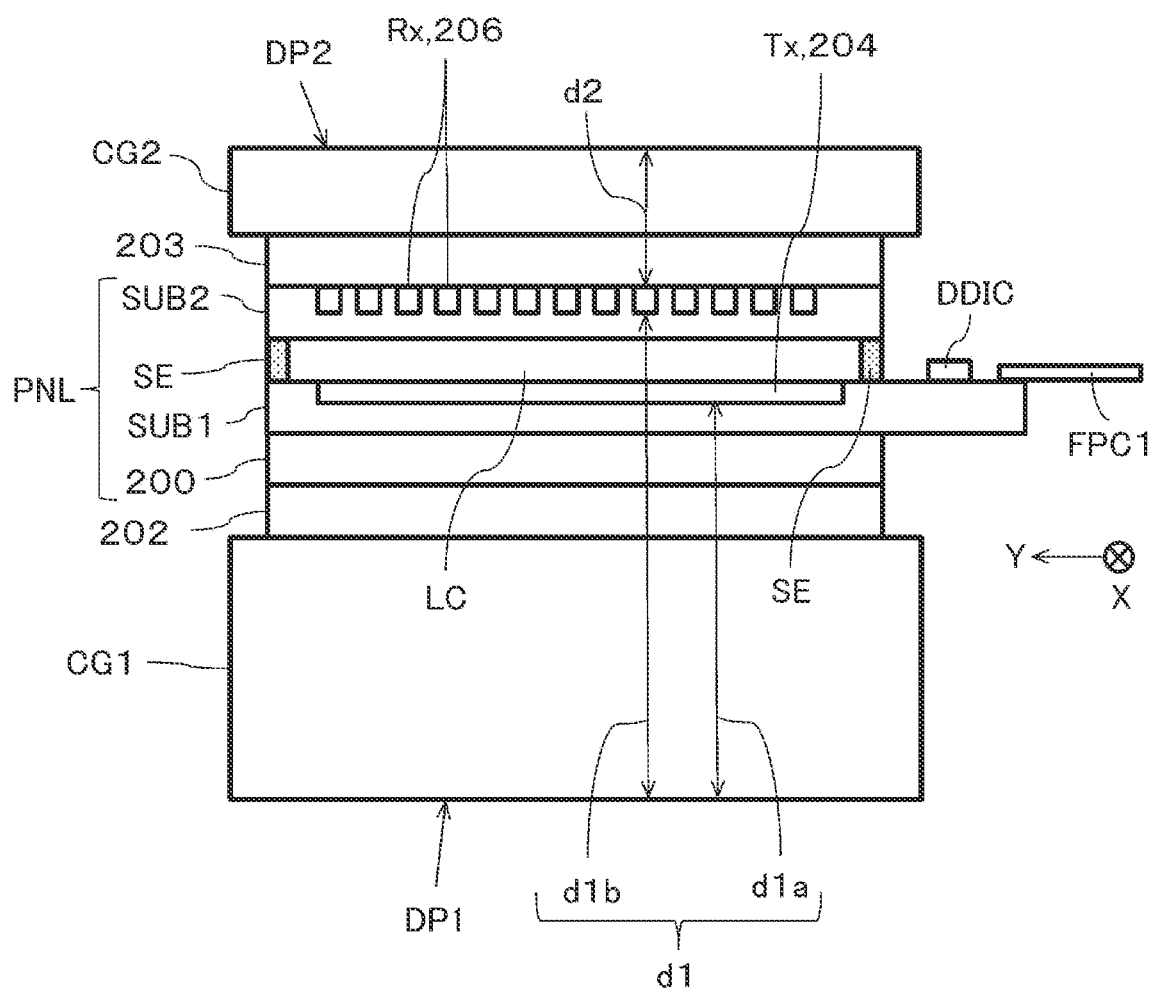
FIG. 2B is a diagram conceptually illustrating a sectional view of the display device relating to another configuration.

FIG. 2B is a diagram conceptually illustrating a sectional view of the display device relating to another configuration. FIGS. 1 and 2A illustrate a configuration example of the display device DSP having the touch panel TP on the display panel PNL, but the display device DSP is not limited thereto. As described above, in the display device DSP, the display panel PNL may be the in-cell type display panel PNL having the touch detection function in the display panel PNL. FIG. 2B illustrates a conceptual sectional view of the display device DSP including the in-cell type display panel PNL. FIG. 2B is different from FIG. 2A in that the plurality of drive electrodes Tx are disposed on the upper side of the first substrate SUB1, the plurality of detection electrodes Rx are disposed on the upper side of the second substrate SUB2, and the touch panel TP, the upper polarizing plate 201, and the lower polarizing plate 200 are removed in FIG. 2B. In addition, in this example, the touch sensor IC chip TPIC and the flexible printed circuit board FPC2 are removed and the circuitries of the touch sensor IC chip are included in the display drive IC chip DDIC. Other configurations illustrated in FIG. 2B are the same as those illustrated in FIG. 2A and duplicate descriptions are omitted.

In the in-cell type display panel PNL illustrated in FIG. 2B, the plurality of drive electrodes Tx to be used in the mutual detection method are shared with common electrodes CE (CE1, CE2, . . . ) (see FIG. 3) disposed on the upper side of the first substrate SUB1. The plurality of detection electrodes Rx to be used in the mutual detection method are disposed on the upper side of the second substrate SUB2.

On the other hand, the detection electrodes to be used in the self-detection method are shared with the common electrodes CE (CE1, CE2, . . . ) (see FIG. 3) disposed on the upper side of the first substrate SUB1. In this case, the drive electrodes Tx illustrated in FIG. 2B are replaced with detection electrodes for the self-detection method. The plurality of detection electrodes Rx illustrated in FIG. 2B may be removed.

Circuit Configuration Example of Display Device

Figure 3:
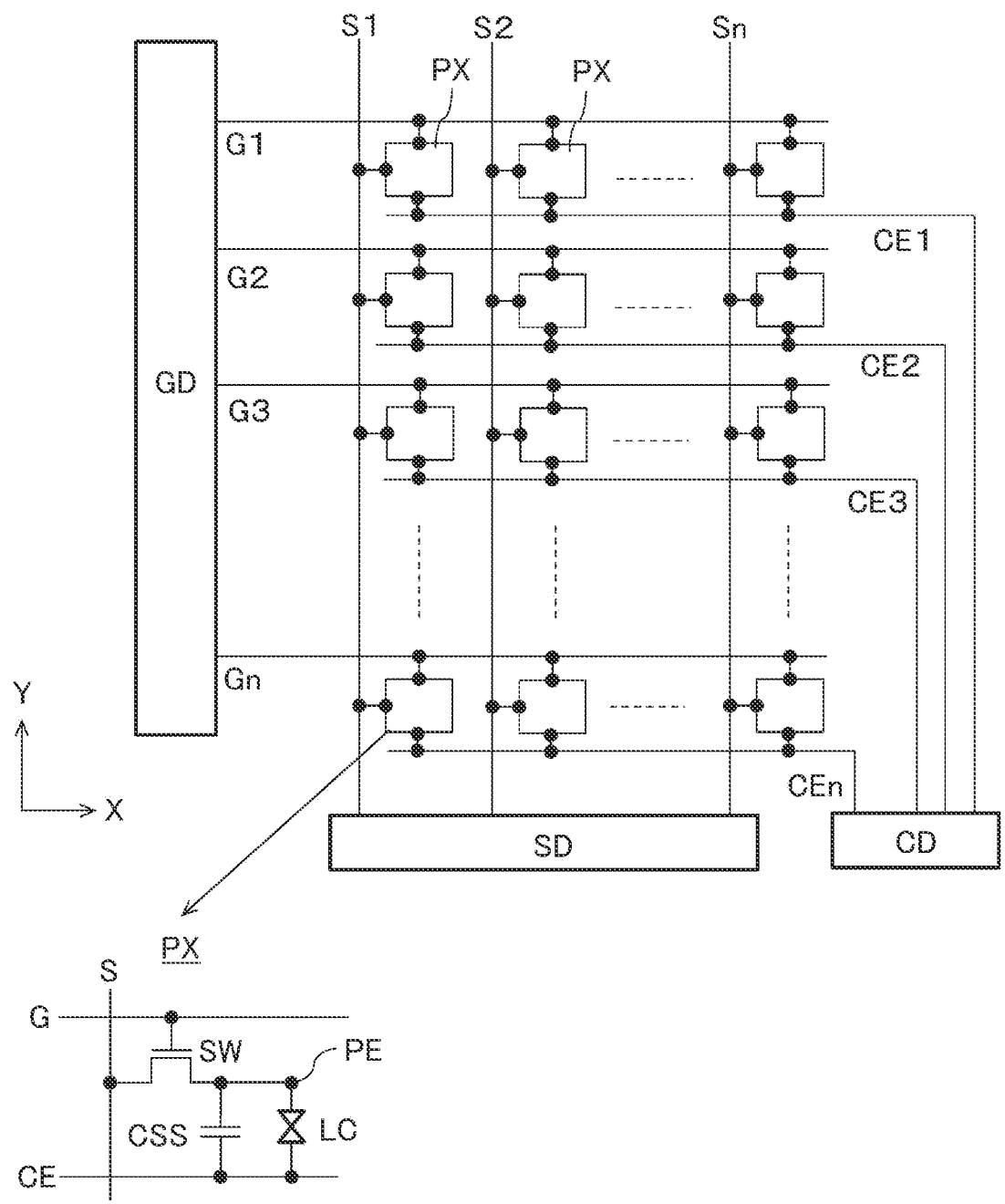
FIG. 3 is a diagram illustrating a basic configuration of an equivalent circuit of a display panel illustrated in FIG. 1 and pixels of the display panel.

FIG. 3 is a diagram illustrating a basic configuration of an equivalent circuit of the display panel illustrated in FIG. 1 and pixels PX. In the display panel PNL, the plurality of pixels PX are arranged in a matrix form in the first direction X and the second direction Y. A plurality of scan lines G (G1, G2, . . . ) are electrically connected to a scan line drive circuit GD. A plurality of signal lines S (S1, S2, . . . ) are electrically connected to a signal line drive circuit SD. The plurality of common electrodes CE (CE1, CE2, . . . ) are electrically connected to a voltage supply unit CD for supplying a common voltage (Vcom) and are arranged across the plurality of pixels PX. Each pixel PX is electrically connected to a single scan line, a single signal line, and a single common electrode. The scan lines G and the signal lines S may not extend linearly, and a part of each of the scan lines G and a part of each of the signal lines S may be bent. For example, even when a part of each of the signal lines S is bent, the signal lines S are treated as signal lines S entirely extending in the second direction Y.

Each of the pixels PX includes a switching element SW, a pixel electrode PE, a common electrode CE, a liquid crystal layer LC, and the like. The switching element SW is constituted by, for example, a thin-film transistor (TFT) and is electrically connected to a scan line G and a signal line S. Each of the scan lines G is electrically connected to each of the switching elements SW of the pixels PX arranged in the first direction X. Each of the signal lines S is electrically connected to each of the switching elements SW of the pixels PX arranged in the second direction Y. Each of the pixel electrodes PE is electrically connected to each of the switching elements SW. Each of the pixel electrodes PE faces the common electrode CE. The liquid crystal layer LC is driven by an electric field generated between the pixel electrodes PE and the common electrode CE. A storage capacitor CSS is formed between an electrode with the same potential as the common electrode CE and an electrode with the same potential as the pixel electrode PE.

As the liquid crystal layer LC, a polymer dispersed liquid crystal (PDLC) can be used as described above.

Touch Detection Method of Touch Panel

Next, the touch panel TP illustrated in FIG. 1 is described. The touch panel TP can be referred to as a sensor panel. As methods for detecting that an external proximity object such as a finger of a user or a pen touches the touch panel TP or is present near the touch panel TP, there are the mutual detection method and the self-detection method as described above.

Mutual Detection Method

Figure 4:
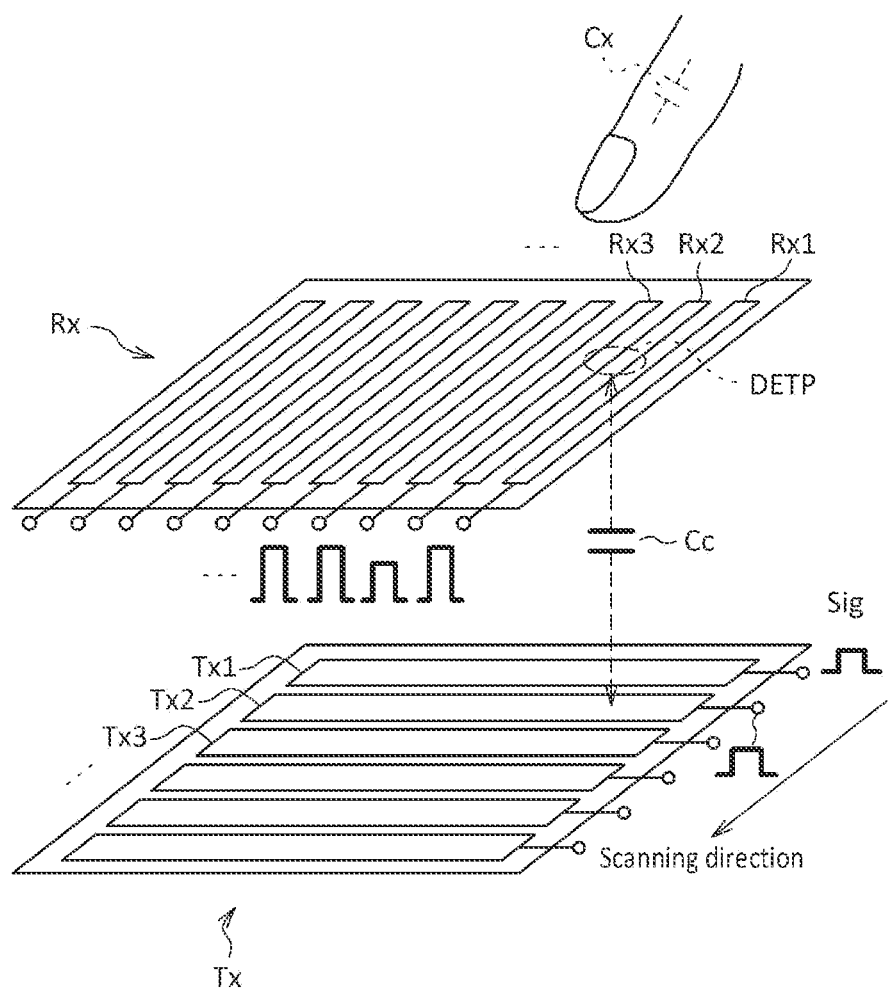
FIG. 4 is a diagram illustrating a representative basic configuration for a mutual detection method.

FIG. 4 is a diagram illustrating a representative basic configuration for the mutual detection method. As a sensor, the plurality of drive electrodes Tx and the plurality of detection electrodes Rx are used.

Each of the drive electrodes Tx is formed in a stripe shape, for example. The plurality of drive electrodes Tx (Tx1, Tx2, Tx3, . . . ) are arrayed in a scan (drive) direction (Y direction or X direction). On the other hand, the plurality of detection electrodes Rx include a plurality of detection electrodes Rx (Rx1, Rx2, Rx3, . . . ) (finer than the drive electrodes). Each of the detection electrodes Rx is formed in a stripe shape, for example. The plurality of detection electrodes Rx (Rx1, Rx2, Rx3, . . . ) are arrayed in a direction (X direction or Y direction) orthogonal to or intersecting the plurality of drive electrodes Tx. The plurality of drive electrodes Tx and the plurality of detection electrodes Rx are arranged with a space between them. Therefore, a capacitor Cc that basically serves as an electrostatic capacitor is present between the plurality of drive electrodes Tx and the plurality of detection electrodes Rx.

A drive pulse (alternating-current signal) is applied to the plurality of drive electrodes Tx for a touch detection period (detection period). That is, for the touch detection period, each of the drive electrodes Tx (Tx1, Tx2, Tx3, . . . ) is scanned based on the drive pulse (Sig) at predetermined intervals. It is assumed that a user's finger is present near an intersection of the detection electrode Rx2 and the drive electrode Tx2. In this case, when the drive pulse (Sig) is supplied to the drive electrode Tx2, a pulse-shaped waveform is obtained in the detection electrodes Rx (Rx1, Rx2, Rx3, . . . ) and a pulse with an amplitude level lower than pulses obtained from the other detection electrodes Rx is obtained from the detection electrode Rx2. The plurality of detection electrodes Rx (Rx1, Rx2, Rx3, . . . ) monitor a fringe electric field from the plurality of drive electrodes Tx (Tx1, Tx2, Tx3, . . . ). When a conductive object such as a finger approaches, the detection electrodes Rx (Rx1, Rx2, Rx3, . . . ) have an effect of shielding this fringe electric field. Detected potentials of the detection electrodes Rx are reduced by the shielding of the fringe electric field.

In the mutual detection method, a difference between the detected potentials can be treated as a detected pulse (detected value) of a position DETP. Capacitance Cx illustrated varies depending on whether a user's finger is close to or away from the detection electrodes Rx. Therefore, the level of the detected pulse varies depending on whether the user's finger is close to or away from the detection electrodes Rx. Thus, the proximity of the user's finger to the flat surface of the touch panel can be determined based on the amplitude level of the detected pulse. It is possible to detect a two-dimensional position of the finger on the flat surface of the touch panel based on the timing of driving an electrode by the drive pulse Sig and the timing of outputting a detected pulse.

Self-Detection Method

Figure 5:
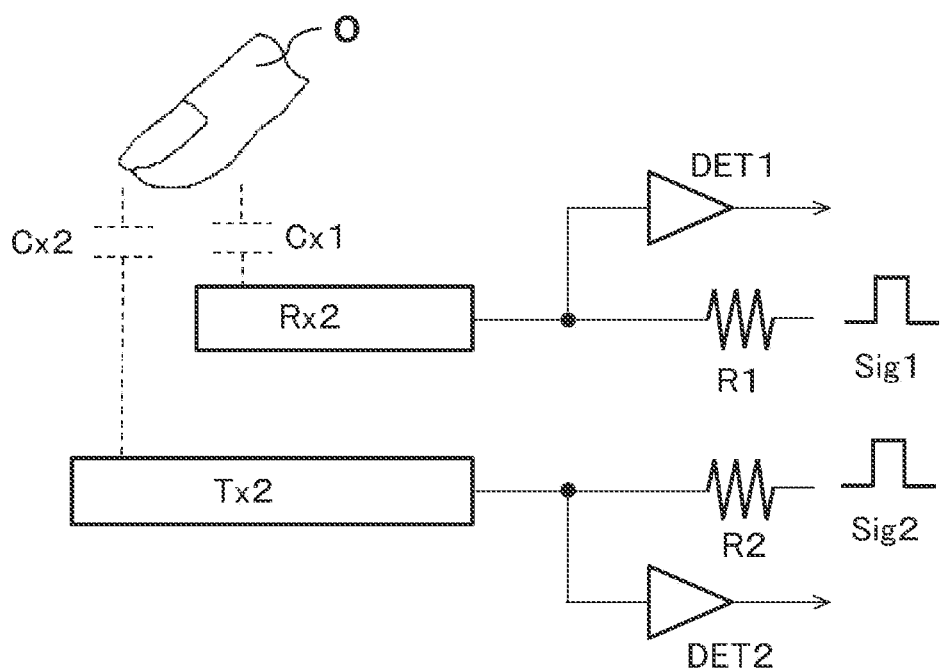
FIG. 5 is a diagram illustrating a representative basic configuration for a self-detection method.

FIG. 5 is a diagram illustrating a representative basic configuration for the self-detection method. In the self-detection method, each of the plurality of detection electrodes Rx and the plurality of drive electrodes Tx is scanned based on a self-detection drive pulse at predetermined time intervals and detects the position and coordinates of a user's finger that is an external proximity object. FIG. 5 exemplifies the detection electrode Rx2 and the drive electrode Tx2 and illustrates a case where a user's finger O is close to or in contact with an intersection of the detection electrode Rx2 and the drive electrode Tx2. Due to the user's finger O, the electrostatic capacitance of the detection electrode Rx2 increases to a value obtained by summing the self-capacitance of the detection electrode Rx2 and capacitance Cx1 caused by the user's finger O. Similarly, the electrostatic capacitance of the drive electrode Tx2 becomes a value obtained by summing the self-capacitance of the drive electrode Tx2 and capacitance Cx2 caused by the user's finger O. In this state, for example, the detection electrode Rx2 is driven based on a self-detection drive pulse Sig1 (alternating-current signal) via predetermined impedance R1, and a capacitor with the increased electrostatic capacitance of the detection electrode Rx2 is charged based on the self-detection drive pulse Sig1.

The detection circuit DET1 detects, based on the value of a charging voltage increased due to the capacitance Cx1, that the user's finger O is present at the detection electrode Rx2. Next, the drive electrode Tx2 is driven based on a self-detection drive pulse Sig2 via predetermined impedance R2, and a capacitor with the increased electrostatic capacitance of the drive electrode Tx2 is charged based on the self-detection drive pulse Sig2. The detection circuit DET2 detects, based on the value of a charging voltage increased due to the capacitance Cx2, that the user's finger O is present at the detection electrode Rx2. Therefore, the fact that the user's finger O is present at the intersection of the detection electrode Rx2 and the drive electrode Tx2 is detected and the position and coordinates of the user's finger O on the flat surface of the touch panel TP are detected.

Although not illustrated in FIG. 5, the plurality of drive electrodes Tx and the plurality of detection electrodes Rx are used as sensors similarly to FIG. 4. The plurality of drive electrodes Tx that are subsequentially driven (scanned) based on the self-detection drive pulse Sig2 include a plurality of stripe-shaped drive electrodes (Tx1, Tx2, Tx3, . . . ) similarly to FIG. 4. The plurality of drive electrodes Tx are arrayed in the Y direction and the X direction. Similarly, the plurality of detection electrodes Rx that are sequentially driven (scanned) based on the self-detection drive pulse Sig1 include a plurality of stripe-shaped detection electrodes (Rx1, Rx2, Rx3, . . . ) (finer than the stripe-shaped drive electrodes) similarly to FIG. 4. The plurality of detection electrodes Rx are arrayed in the direction (X direction or Y direction) orthogonal to or intersecting the plurality of drive electrodes Tx.

By sequentially driving (scanning) the plurality of detection electrodes Rx and the plurality of drive electrodes Tx using the configuration illustrated in FIG. 5 and the self-detection method, the position of the external proximity object O can be detected from intersections of the plurality of detection electrodes Rx and the plurality of drive electrodes Tx. For the touch detection period for the detection by the self-detection method, the plurality of detection electrodes Rx and the plurality of drive electrodes Tx can be treated as detection electrodes.

In addition, in the self-detection method, a touch sensor may sequentially drive (scan) only the plurality of detection electrodes Rx based on the self-detection drive pulse Sig1, detect whether an external proximity object such as a finger is present, and switch the detection method to the mutual detection method to detect coordinates of the external proximity object. In addition, the detection electrodes Rx may not be provided and the plurality of drive electrodes Tx may be arranged in a matrix form in a row direction (X direction) and a column direction (Y direction) and coordinates of the external proximity object such as a finger may be detected by the self-detection method using only the plurality of drive electrodes Tx.

Although not illustrated in FIGS. 4 and 5, a switch or the like may be configured to switch between the mutual detection method and the self-detection method. In addition, the configuration for the self-detection method illustrated in FIG. 5 is an example and is not limited thereto.

Properties of Transparent Display

Figure 6:
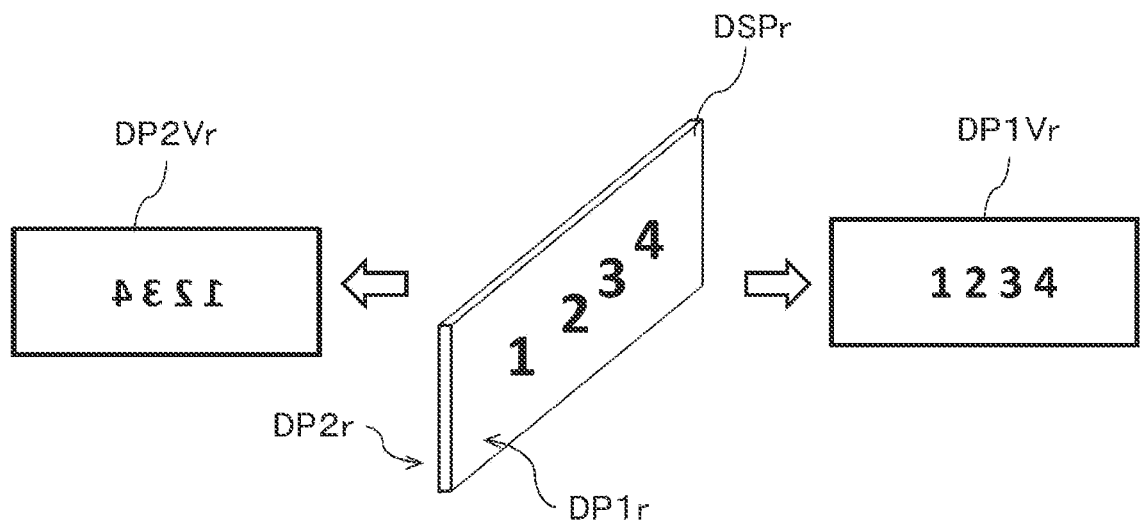
FIG. 6 is a diagram describing properties of a transparent display.

Next, properties of the transparent display are described using FIG. 6. FIG. 6 is a diagram describing properties of the transparent display. A display device DSPr as the transparent display includes a first screen DP1r as a front screen and a second screen DP2r as a back screen on the side opposite to the first screen DP1r. As illustrated in FIG. 6, when "1 2 3 4" is displayed on the display device DSPr, a display image DP1Vr viewed from the first screen DP1r side is an image equivalent to "1 2 3 4". On the other hand, since the display DSPr is the transparent display, a display image DP2Vr viewed from the second screen DP2r side is an image obtained by inverting "1 2 3 4" by 180 degrees. Therefore, since the display image DP2Vr is obtained by inverting the image "1 2 3 4" by 180 degrees, it is considered that when an observer or user (hereinafter referred to as an observer) views the display device DSPr from the second screen DP2r side, display information displayed on the display device DSPr cannot be appropriately used or cannot be appropriately understood.

Description of Transparent Display According to Embodiment

Figure 7:
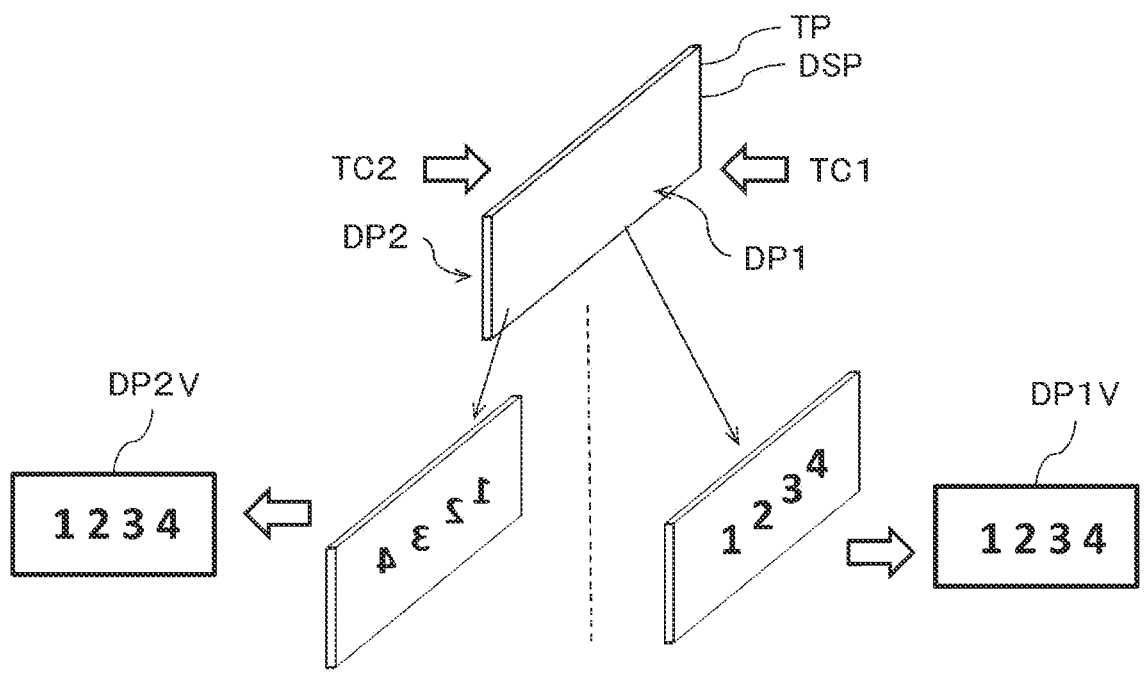
FIG. 7 is a diagram conceptually illustrating a transparent display according to the embodiment.

FIG. 7 is a diagram conceptually describing the transparent display according to the embodiment. The display device DSP as the transparent display includes the touch panel TP capable of detecting a touched screen (touched surface or touched side). The display device DSP includes the first screen DP1 as a front screen and the second screen DP2 as a back screen on the side opposite to the first screen DP1. Since the touch panel TP is included in the display device DSP, whether the first screen DP1 or the second screen DP2 is touched by an observer can be determined based on a touch detection result of detecting a touch by the touch panel TP. The display device DSP identifies, based on the touch detection result, whether a screen touched by the observer is the first screen DP1 or the second screen DP2. Then, the display device DSP provides an appropriate display image to the identified screen (DP1 or DP2).

It is assumed that "1 2 3 4" is displayed on the display device DSP. When the observer is present on the first screen DP1 side and a finger of the observer touches the first screen DP1 as indicated by TC1, a display image DP1V viewed from the first screen DP1 side is a correct image equivalent to "1 2 3 4". On the other hand, when the observer is present on the second screen DP2 side and a finger of the observer touches the second screen DP2 as indicated by TC2, the display device DSP performs display control processing to invert a display image by 180 degrees using the correct display image on the first screen DP1 as a reference and display the display image DP2V such that the display image DP2V viewed from the second screen DP2 side correctly displays "1 2 3 4".

Method for Detecting Touched Screen

Figure 8:
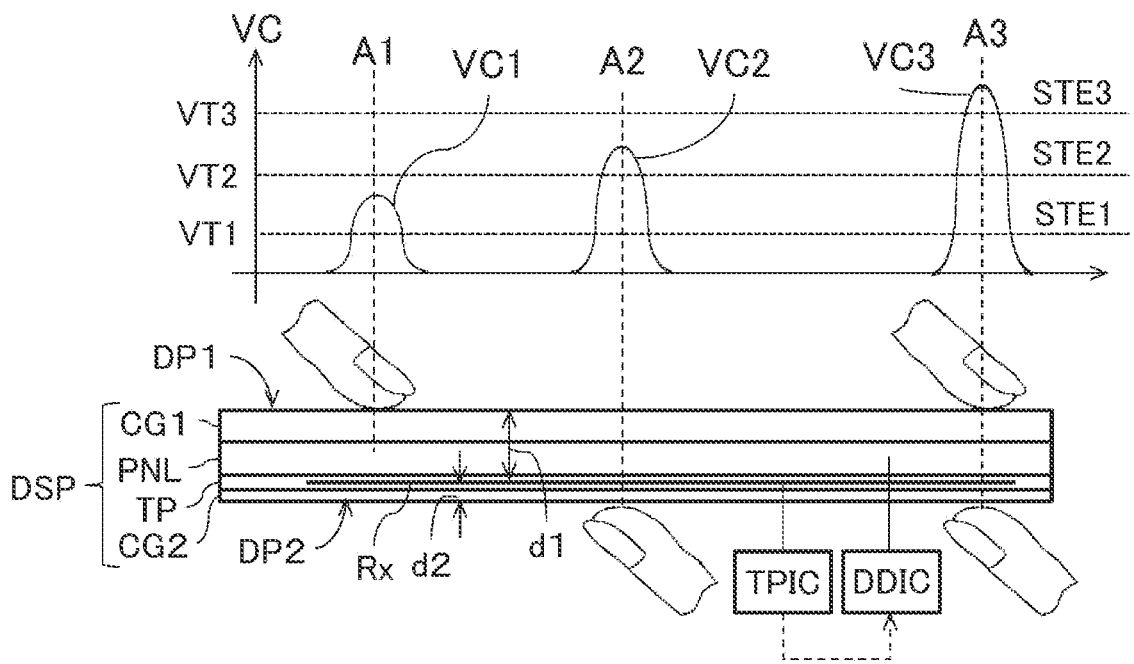
FIG. 8 is a diagram describing a configuration example of the display device according to the embodiment and a method for detecting a touched screen.

FIG. 8 is a diagram illustrating a configuration example of the display device according to the embodiment and describing a method for detecting a touched screen. FIG. 8 illustrates the display device DSP illustrated in FIGS. 1 and 2 in a simplified manner. The display device DSP includes the cover glass CG1, the display panel PNL, the touch panel TP, the cover glass CG2, the display drive IC chip DDIC, and the touch sensor IC chip TPIC. The display panel PNL is disposed between the cover glass CG1 and the touch panel TP. The touch panel TP is disposed between the display panel PNL and the cover glass CG2. The first screen DP1 is the surface of the cover glass CG1 that is opposite to the surface of the cover glass CG1 on the display panel PNL side. The second screen DP2 is the surface of the cover glass CG2 that is opposite to the surface of the cover glass CG2 on the touch panel TP side. In this example, the thickness of the cover glass CG1 is larger than the thickness of the cover glass CG2. It can be said that the first screen DP1 and the second screen DP2 are touch screens.

The touch panel TP includes the plurality of detection electrodes for detecting a touch. FIG. 8 schematically illustrates a single detection electrode Rx as a representative example of the plurality of detection electrodes. The detection electrodes Rx are electrically connected to the touch sensor IC chip TPIC as a controller of the touch panel TP.

A distance d1 between each of the detection electrodes Rx of the touch panel TP and the first screen DP1 is longer than a distance d2 between each of the detection electrodes Rx of the touch panel and the second screen DP2 (d1>d2). When the detection method of the touch panel TP is the mutual detection method, d1 corresponds to the distance d1b illustrated in FIG. 2. When the detection method of the touch panel TP is the self-detection method, d1 corresponds to the distance d1a illustrated in FIG. 2.

Therefore, the amount VC of a change in a capacitance value that is a value detected by the touch panel TP varies depending on whether a finger touches the first screen DP1 or the second screen DP2. As a method for detecting a touched screen according to the embodiment, the touched screen is determined using a difference between amounts VC of changes in the capacitance value.

In FIG. 8, as indicated by a dotted line A1, when a finger touches the first screen DP1, the amount VC of a change in the capacitance value is indicated by a first changed state VC1. As indicated by a dotted line A2, when the finger touches the second screen DP2, the amount VC of a change in the capacitance value is indicated by a second changed state VC2. In addition, as indicated by a dotted line A3, when the finger touches the first screen DP1 and the second screen DP2, the amount VC of a change in the capacitance value is indicated by a third changed state VC3.

The controller (TPIC) of the touch panel TP has, as thresholds for a detected value, three thresholds (VT1, VT2, and VT3) for the amount VC of a change in the capacitance value. The three thresholds are a first threshold VT1, a second threshold VT2 larger than the first threshold VT1, and a third threshold VT3 larger than the second threshold VT2 (VT1<VT2<VT3).

When the detected value is in a first range STE1 between the first threshold VT1 and the second threshold VT2, the controller (TPIC) of the touch panel TP determines that the first screen DP1 has been touched. When the detected value is in the first changed state VC1, for example, the maximum value of the first changed state VC1 is in the first range STE1 and the controller (TPIC) of the touch panel TP determines that the first screen DP1 has been touched.

When the detected value is in a second range STE2 between the second threshold VT2 and the third threshold VT3, the controller (TPIC) of the touch panel TP determines that the second screen DP2 has been touched. When the detected value is in the second changed state VC2, for example, the maximum value of the second changed state VC2 is in the second range STE2 and the controller (TPIC) of the touch panel TP determines that the second screen DP2 has been touched.

When the detected value is in a third range STE3 equal to or larger than the third threshold VT3, the controller (TPIC) of the touch panel TP determines that the first screen DP1 and the second screen DP2 have been touched. When the detected value is in the third changed state VC3, for example, the maximum value of the third changed state VC3 is in the range equal to or larger than the third threshold VT3 and the controller (TPIC) of the touch panel TP determines that the first screen DP1 and the second screen DP2 have been touched.

The display drive IP chip DDIC electrically connected to the display panel PNL controls displaying of the display panel PNL based on a result of determining a touched screen from the controller (TPIC).

When the controller (TPIC) determines that the first screen DP1 has been touched, the display drive IC chip DDIC displays, on the first screen DP1, a display image that is correct when the display image is viewed from the first screen DP1 side. When the controller (TPIC) determines that the second screen DP2 has been touched, the display drive IC chip DDIC displays, on the second screen DP2, a display image that is correct when the display image is viewed from the second screen DP2 side. When the controller (TPIC) determines that the first screen DP1 and the second screen DP2 have been touched, the display drive IC chip DDIC keeps a screen on which a correct display image is displayed.

According to the embodiment, it is possible to display, on the display device DSP as the transparent display, an appropriate display image corresponding to the position of an observer.

Modifications of Display Device

Next, modifications of the display device are described.

First Modification

Figure 9:
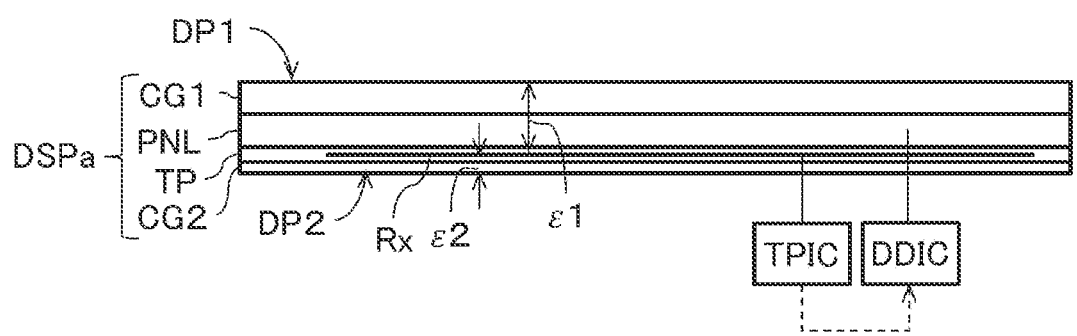
FIG. 9 is a diagram describing a configuration example of a display device according to a first modification.

FIG. 9 is a diagram illustrating a configuration example of a display device according to a first modification. A display device DSPa illustrated in FIG. 9 is different from the display device DSP illustrated in FIG. 8 in that a dielectric constant ε1 between the detection electrodes Rx and the first screen DP1 is lower than a dielectric constant ε2 between the detection electrodes Rx and the second screen DP2 (ε1<ε2). Other configurations and operations of the display device DSPa illustrated in FIG. 9 are the same as or similar to the configurations and operations of the display device DSP illustrated in FIG. 8, and duplicate descriptions will be omitted.

Even the display device DSPa according to the first modification has the same effects as those described in the embodiment.

Second Modification

A display device may have a configuration of a combination of the display device DSP illustrated in FIG. 8 and the display device DSPa illustrated in FIG. 9. That is, the display device according to the second modification has the following configuration.

A distance d1 between each of the detection electrodes Rx and the first screen DP1 is longer than a distance d2 between each of the detection electrodes Rx and the second screen DP2 (d1>d2), and the dielectric constant el between the detection electrodes Rx and the first screen DP1 is lower than dielectric constant ε2 between the detection electrodes Rx and the second screen DP2 (ε1<ε2).

The display device according to the second modification can have the same effects as those described in the embodiment.

Modifications of Method for Detecting Touched Screen

Next, modifications of the method for detecting a touched screen are described.

Third Modification

Figure 10:
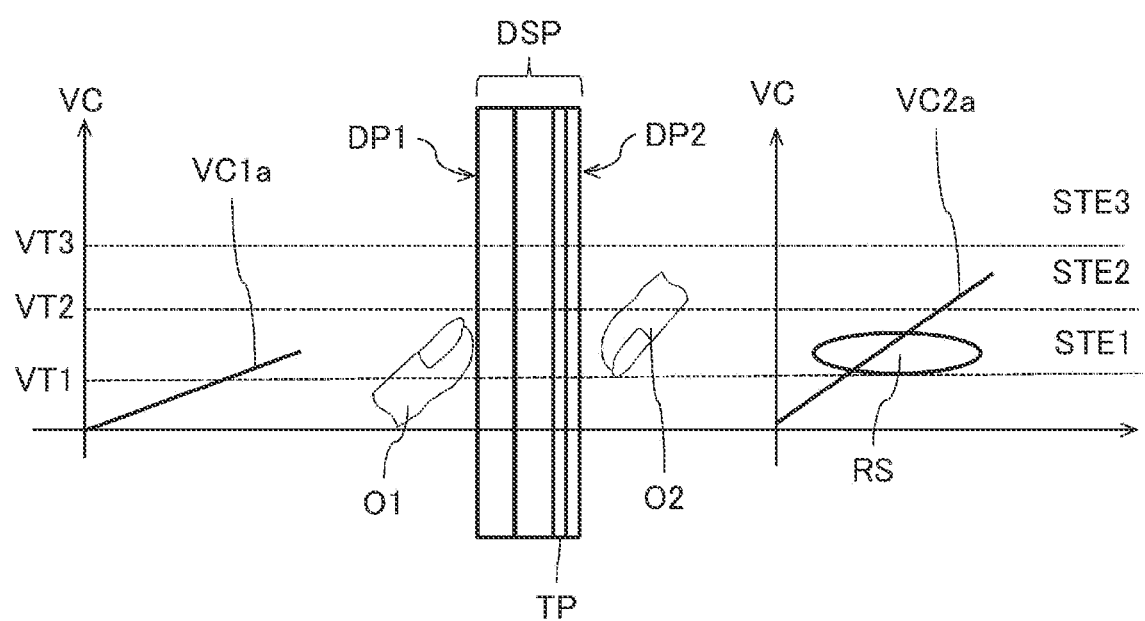
FIG. 10 is a diagram describing a case where it is difficult to determine a touched screen.

In the method for detecting a touched screen as described with reference to FIG. 8, it may be difficult to determine a touched screen. FIG. 10 is a diagram describing a case where it is difficult to determine a touched screen.

In FIG. 10, a line VC1a indicates a change in capacitance for a time period from a time when a finger O1 approaches the first screen DP1 to a time when the finger O1 contacts (touches) the first screen DP1. A line VC2a indicates a change in capacitance for a time period from a time when a finger O2 approaches the second screen DP2 to a time when the finger O2 contacts (touches) the second screen DP2. In a state where the finger O2 is in contact with (touching) the second screen DP2 after approaching the second screen DP2, the change in the capacitance that is indicated by the line VC2a passes through the range between the first threshold VT1 and the second threshold VT2 and reaches the range between the second threshold VT2 and the third threshold VT3. Therefore, in a state RS where the change in the capacitance that is indicated by the line VC2a is in the range between the first threshold VT1 and the second threshold VT2, when a touched screen is determined, it may be erroneously determined that the finger O2 has touched the first screen DP1.

Basically, it is considered that a time period for which the finger O1 or the finger O2 is away from the first screen DP1 or the second screen DP2 by a certain distance is shorter than a time period for which the finger O1 or the finger O2 is in contact with the first screen DP1 or the second screen DP2. Therefore, it is preferable to set a time constraint on the determination in a time period for the determination of a touched screen.

Figure 11:
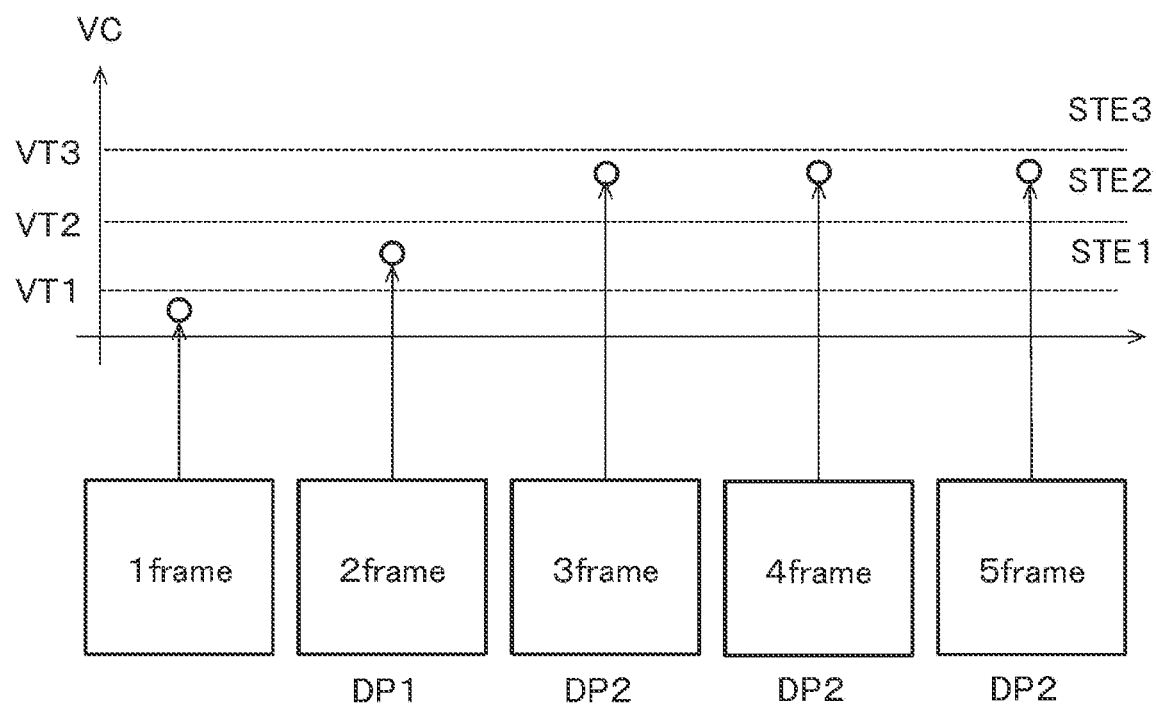
FIG. 11 is a diagram describing a method for detecting a touched screen according to a third modification.

FIG. 11 is a diagram describing a method for detecting a touched screen according to a third modification. In the third modification, the controller (TPIC) of the touch panel TP determines a touched screen when a detected value of a change in capacitance is in the first range STE1, the second range STE2, or the third range STE3 for a predetermined time period or longer. In this example, the predetermined time period or longer is a predetermined number of frames or more. In FIG. 6, as an example, the predetermined number of frames is 3 but is not limited thereto. The predetermined number of frames may be 2, 4, or 5. It is assumed that the detection and determination of a touched screen are performed in units of frames.

As illustrated in FIG. 11, the detection and determination of a touched screen are performed for first to fifth frames (1frame to 5frame). For the first frame (1frame), a detected value of a change in capacitance that is indicated by a circle is equal to or smaller than the first threshold VT1, and thus the controller (TPIC) does not perform the determination of a touched screen. For the second frame (2frame), a detected value of a change in the capacitance that is indicated by a circle is in the first range STE1, and thus the controller (TPIC) determines that the first screen DP1 has been touched. However, in this stage, the confirmation of the touched screen is not performed. For the third to fifth frames (3frame to 5frame), detected values of changes in capacitance that are indicated by circles are continuously in the second range STE2, and thus the controller (TPIC) determines that the second screen DP2 has been touched. Since the controller (TPIC) continuously determines that the second screen DP2 has been touched for a time period of the three frames, the controller (TPIC) confirms the determination of the touch to the second screen DP2.

According to the third modification, it is possible to accurately determine a touched screen.

Fourth Modification

Figure 12:
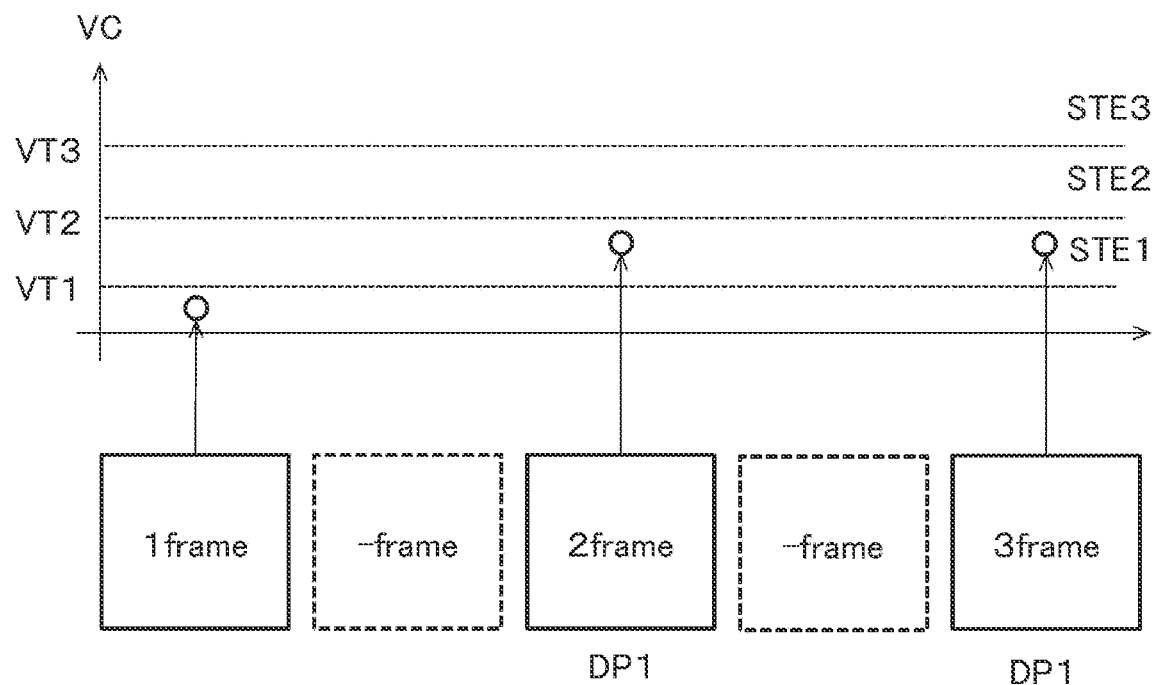
FIG. 12 is a diagram describing a method for detecting a touched screen according to a fourth modification.

In the third modification, the detection and determination of a touched screen are performed for each of the continuous first to fifth frames, but are not limited thereto. In a fourth modification, to reduce power consumption of the display device DSP and reduce power consumption of the controller (TPIC) of the touch panel TP, the detection and determination of a touched screen are performed for each of multiple frames provided intermittently. FIG. 12 is a diagram describing a method for detecting a touched screen according to the fourth modification.

As illustrated in FIG. 12, a frame for the detection and determination is not provided between the first frame (1frame) and the second frame (2frame) and between the second frame (2frame) and the third frame (3frame). For the first frame (1frame), a detected value of a change in capacitance that is indicated by a circle is equal to or smaller than the first threshold VT1, and the controller (TPIC) does not perform the determination of a touched screen. For the second frame (2frame), a detected value of a change in the capacitance that is indicated by a circle is in the first range STE1, and the controller (TPIC) determines that the first screen DP1 has been touched. However, in this stage, the confirmation of the touched screen is not performed. For the third frame (3frame), a detected value of a change in the capacitance that is indicated by a circle is in the first range STE1, and the controller (TPIC) determines that the first screen DP1 has been touched. Since the determination of the touch to the first screen DP1 has been made for the continuous two frames, which are the second frame (2frame) and the third frame (3frame) that are multiple frames provided intermittently, the controller (TPIC) confirms the determination of the touch to the first screen DP1.

According to the fourth modification, it is possible to accurately determine a touched screen while reducing power consumption of the display device DSP and reducing power consumption of the controller (TPIC) of the touch panel TP.

Fifth Modification

In each of the third and fourth modifications, the method for detecting a touched screen with a time constraint on the determination in a time period for the determination of a touched screen is described, but the method is not limited thereto. An area constraint on a detected value in the determination in a time period for the determination of a touched screen may be provided. In a fifth modification, a method for detecting a touched screen with an area constraint on a detected value in the determination in a time period for the determination of a touched screen is described.

Basically, even when detected values indicate the same change in capacitance values, the area of a distribution of a change in the capacitance value when the finger O1 or O2 is away from the first screen DP1 or the second screen DP2 by a certain distance is different from the area of a distribution of a change in the capacitance value when the finger O1 or O2 is in contact with the first screen DP1 or the second screen DP2. Therefore, it is preferable to set an area constraint on a detected value in the determination in a time period for the determination of a touched screen.

Figure 13:
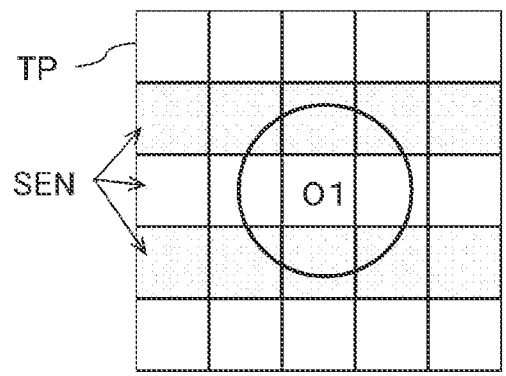
FIG. 13 is a diagram schematically illustrating a relationship between a sensor region of a touch panel and a finger.
Figure 14:
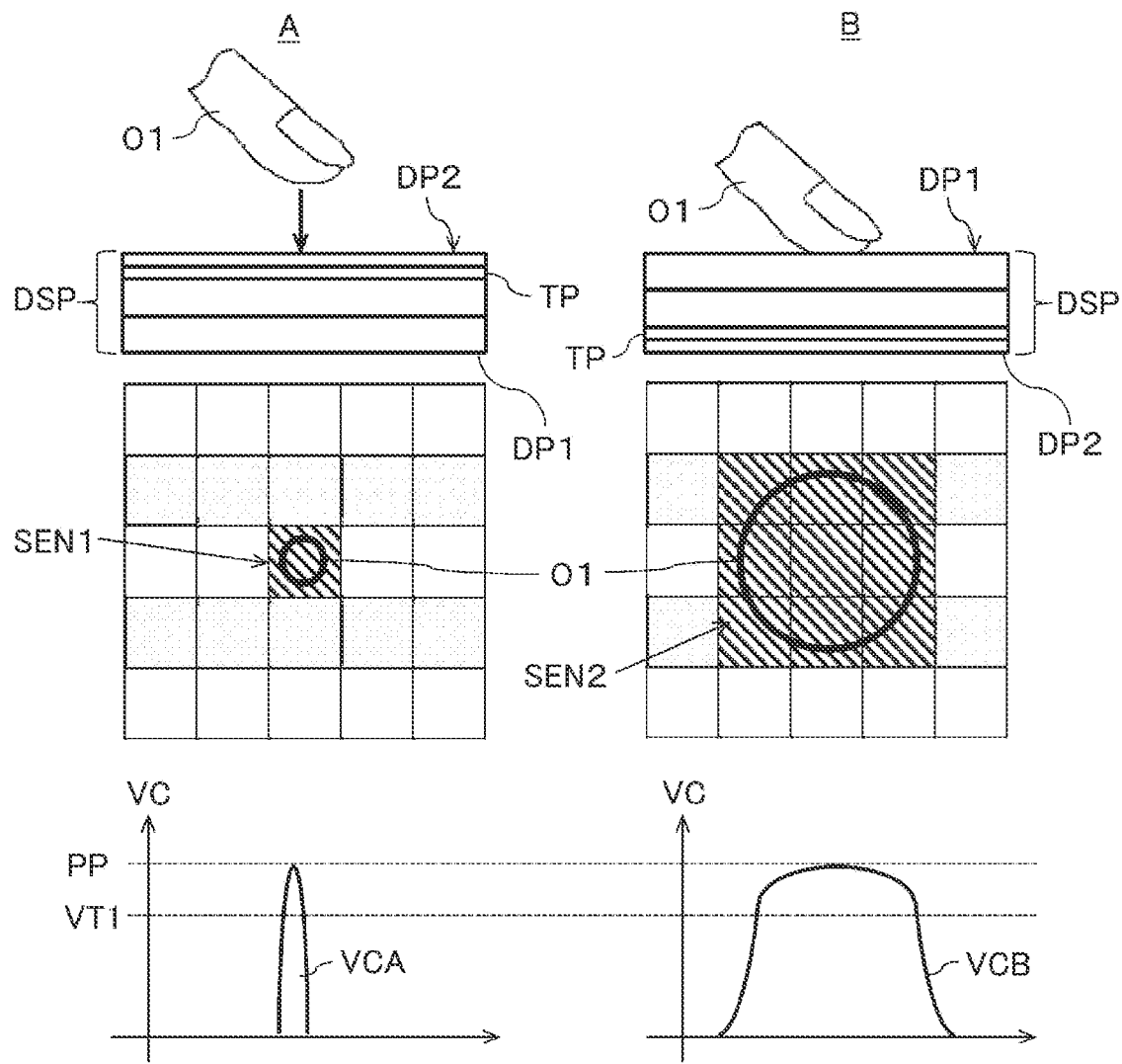
FIG. 14 is a diagram describing a method for detecting a touched screen according to a fifth modification.

FIG. 13 is a diagram schematically illustrating a relationship between a sensor region of the touch panel and a finger. FIG. 14 is a diagram describing a method for detecting a touched screen according to the fifth modification.

As illustrated in FIG. 13, the touch panel TP includes a plurality of sensor regions SEN arranged in a matrix form in plan view. FIG. 13 illustrates 25 sensor regions SEN as an example. When the finger O1 indicated by a circle touches the touch panel TP, detected values are obtained from nine sensor regions.

In FIG. 14, a side A indicates a state where the finger O1 is close to the second screen DP2 (and not in contact with the second screen DP2), and a side B indicates a state where the finger O1 is in contact with the first screen DP1.

On the side A, there is a distance between the finger O1 and the second screen DP2, and a detected value VCA is obtained from a single sensor region SEN1 hatched among the plurality of sensor regions SEN of the touch panel TP. On the other hand, on the side B, the finger O1 is in contact with the first screen DP1, and detected values VCB are obtained from nine sensor regions SEN2 hatched among the plurality of sensor regions SEN of the touch panel TP. Even when the peak value PP of the detected value VCA is the same as the peak value PP of the detected values VCB, the numbers of sensors that have performed the detection or the areas of the sensor regions in which the detection has been performed are different. Therefore, for example, the width of the detected values VCB equal to or larger than the first threshold VT1 is larger than the width of the detected value VCA equal to or larger than the first threshold VT1. Therefore, the number of sensors that have performed the detection or the area of sensor regions in which the detection has been performed is equal to or larger than a predetermined number of sensors or a predetermined area, the determination of a touched screen is confirmed by the controller (TPIC).

According to the fifth modification, it is possible to accurately determine a touched screen.

Operational Flow of Display Device

Figure 15:
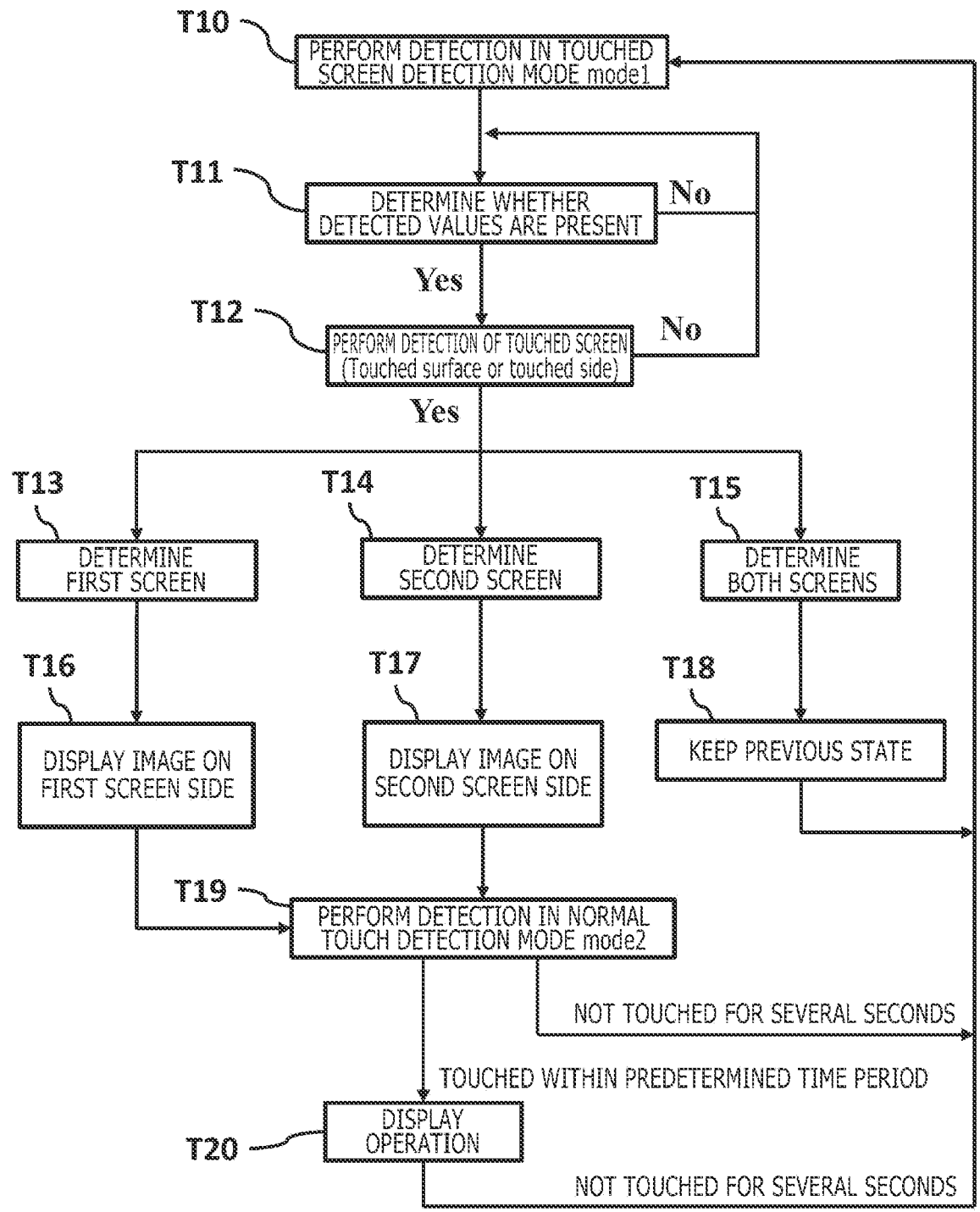
FIG. 15 is a diagram describing an operational flow of the display device according to the embodiment.

Next, an operation of the display device DSP is described with reference to FIG. 15. FIG. 15 is a diagram describing an operational flow of the display device according to the embodiment. The display device DSP has a touched screen detection mode (mode1) and a normal touch detection mode (mode2). In the touched screen detection mode (mode1), it is determined whether the first screen DP1 or the second screen DP2 is a touched screen (touched surface or touched side) or whether the first screen DP1 and the second screen DP2 are touched screens. In the normal touch detection mode (mode2), the position and coordinates of a finger, a pen, or the like on the two-dimensional flat surface of the touch panel TP are detected.

Step T10

The controller (TPIC) of the touch panel TP performs a detection operation of detecting a touch to the first screen DP1 or the second screen DP2 by a finger or the like in the touched screen detection mode (mode1). The touched screen detection mode (mode1) can be implemented by the self-detection method. The touched screen detection mode (mode1) may be implemented by the mutual detection method.

Step T11

The controller (TPIC) of the touch panel TP determines whether detected values from a plurality of detection electrodes Rx are present. When the detected values are not present (No), step T11 is repeated. When the detected values are present (Yes), the operation proceeds to step T12.

Step T12

The controller (TPIC) of the touch panel TP performs the detection of a touched screen based on the detected values. When the detected values are equal to or smaller than the first threshold VT1 (No), the controller (TPIC) does not perform the detection of a touched screen and the operation proceeds to step T11. When the detected values are equal to or larger than the first threshold VT1 (Yes), the controller (TPIC) performs the detection of a touched screen. In the detection of a touched screen, the operation transitions to step T13, T14, or T15. In each of steps T13, T14, and T15, one of the detections methods of the third to fifth modifications is used.

Step T13

When the detected values are in the first range STE1, the controller (TPIC) of the touch panel TP determines that the first screen DP1 has been touched.

Step T14

When the detected values are in the second range STE2, the controller (TPIC) of the touch panel TP determines that the second screen DP2 has been touched.

Step T15

When the detected values are in the third range STE3, the controller (TPIC) of the touch panel TP determines that the first screen DP1 and the second screen DP2 have been touched.

Step T16

The display drive IC chip DDIC displays a correct display image on the first screen DP1 side based on the determination that the first screen DP1 has been touched in step T13. After that, the operation proceeds to step T19.

Step T17

The display drive IC chip DDIC displays a correct display image on the second screen DP2 based on the determination that the second screen DP2 has been touched in step T14. After that, the operation proceeds to step T19.

Step T18

The display drive IC chip DDIC keeps the state of the previous display (display on the first screen DP1 side or display on the second screen DP2 side) based on the determination that the first screen DP1 and the second screen DP2 have been touched in step T15. After that, the operation proceeds to step T10.

Step T19

The controller (TPIC) of the touch panel TP causes the mode to transition to the normal touch detection mode (mode2) in which the touch panel TP is used. In the touch detection mode, the position and coordinates of a finger, a pen, or the like on the two-dimensional flat surface of the touch panel TP are detected. When a finger, a pen, or the like does not touch the touch panel TP for a predetermined time period (of several seconds) from the detection of a touched screen, the operation proceeds to step T10, the mode is changed to the touched screen detection mode (mode1) again, and the touch panel TP waits for the next screen (next surface or next side) touch operation. The normal touch detection mode (mode2) can be implemented by the mutual detection method. The normal touch detection mode (mode2) may be implemented by the self-detection method.

Step T20

When a finger, a pen, or the like continuously touches the touch panel TP for a predetermined time period or more from the detection of a touched screen, or when a finger, a pen, or the like touches the touch panel TP again within the predetermined time period, the operation proceeds to step T20 and a display operation is performed according to the detected touched coordinates. As the display operation according to the detected touched operation, a display image is switched according to the detected touched coordinates or is enlarged, reduced, moved, or the like by a swipe operation. After the end of the display operation, when a finger, a pen, or the like does not touch the touch panel TP for a predetermined time period (of several seconds), the operation proceeds to step T10, the mode is changed to the touched screen detection mode (mode1) again, and the touch panel TP waits for the next screen touch operation.

Operation Example of Display Panel and Touch Panel

Figure 16:
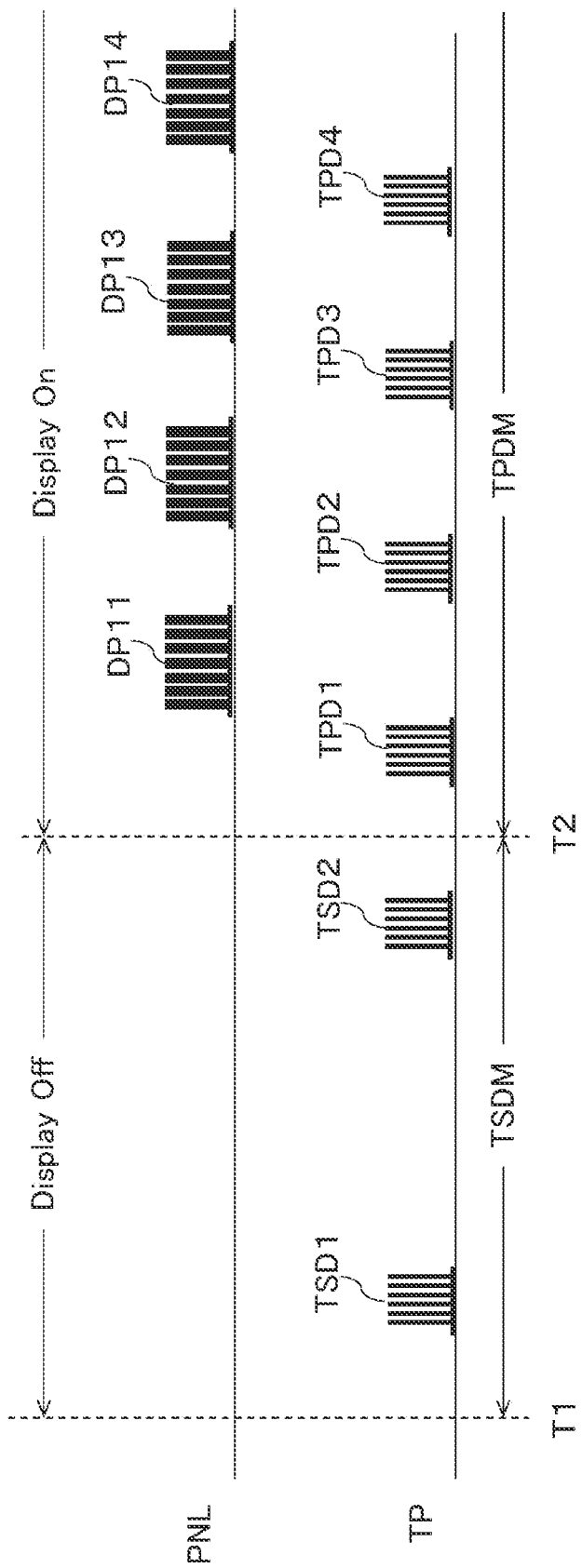
FIG. 16 is a diagram describing an operation example of the display panel and the touch panel.

FIG. 16 is a diagram describing an operation example of the display panel and the touch panel. The display panel PNL is in a non-display state (display off) where an image is not displayed in a display region DA for a time period from a time t1 to a time t2. On the other hand, the touch panel TP is in a touched screen detection mode TSDM for the time period from the time t1 to the time t2 and performs a first touched screen detection operation TSD1 and a second touched screen detection operation TSD2 within the time period from the time t1 to the time t2.

In the first touched screen detection operation TSD1 and the second touched screen detection operation TSD2, for example, when it is detected that the first screen DP1 has been touched, the touch panel TP transitions to a normal touch detection mode TPDM after the time t2. On the other hand, when the touched screen is detected, the display panel PNL transitions to a display state (display on) after the time t2. In the display state (display on), a display image is displayed such that a normal image is displayed on a display screen on which the display region DA of the display panel PNL is determined to have been touched. The number of times that a touched screen detection operation is performed in the touched screen detection mode TSDM may be 3 or more.

After the time t2, the touch panel TP performs a first touch detection operation TPD1, a second touch detection operation TPD2, a third touch detection operation TPD3, a fourth touch detection operation TPD4, and the like at predetermined time intervals. On the other hand, after the time t2, the display panel PNL performs a first display operation DP11, a second display operation DP12, a third display operation DP13, a fourth display operation DP14, and the like at predetermined time intervals to display a display image on the first screen DP1 side.

As illustrated in FIG. 16, the first to fourth touch detection operations TPD1 to TPD4 and the first to fourth display operations DP11 to DP14 are performed such that each of time periods for the first to fourth touch detection operations TPD1 to TPD4 does not overlap time periods for the first to fourth display operations DP11 to DP14. In addition, a detection time interval between the touched detection operations (TSD1 and TSD2) within the time period from the time t1 to the time t2 is set to be longer than detection time intervals between the touch detection operations (TPD1 to TPD4) after the time t2 in order to reduce power consumption.

Another Operation Example of Display Panel and Touch Panel

Figure 17:
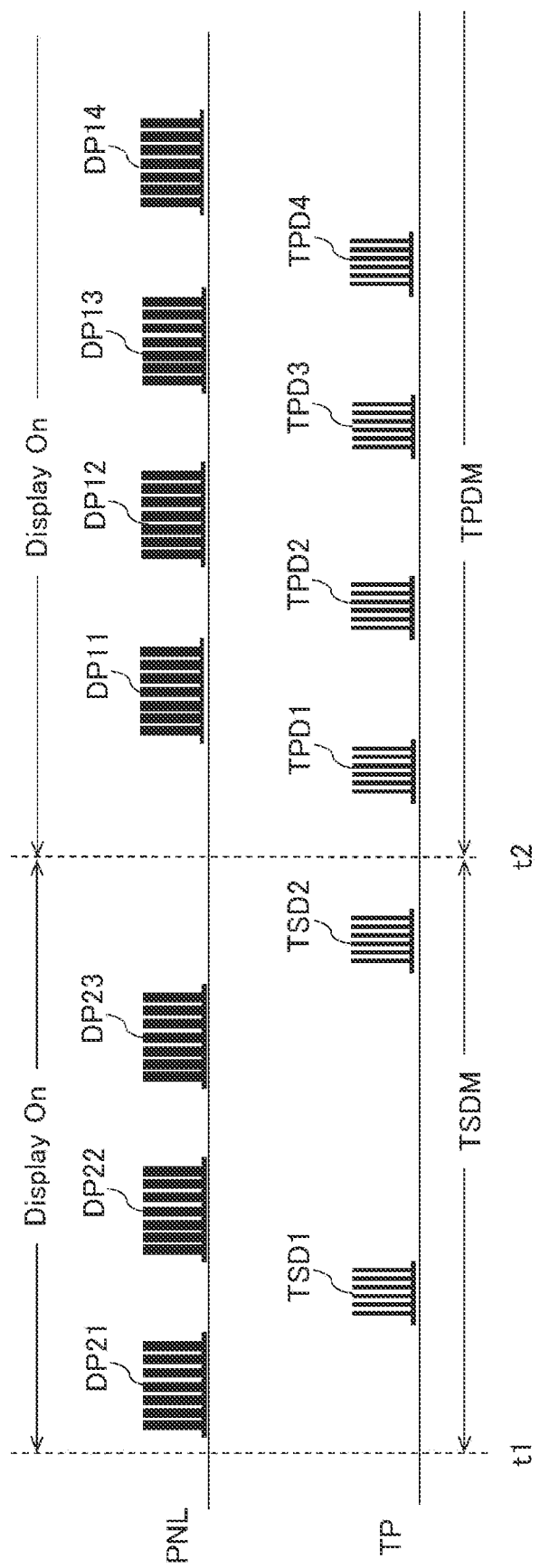
FIG. 17 is a diagram describing another operation example of the display panel and the touch panel.

FIG. 17 is a diagram describing another operation example of the display panel and the touch panel. FIG. 17 is different from FIG. 16 in that the display panel PNL is in the display state (display on) for the time period from the time t1 to the time t2 in FIG. 17. In the time period from the time t1 to the time t2, the display panel PNL performs an operation of displaying an image on the second screen DP2 side. The display panel PNL performs a first display operation DP21, a second display operation DP22, and a third display operation DP23 at predetermined time intervals to display a display image on the second screen DP2 side. In the same manner as FIG. 16, the touch panel TP is in the touched screen detection mode TSDM for the time period from the time t1 to the time t2 and performs the first touched screen detection operation TSD1 and the second touched screen detection operation TSD2 within the time period from the time t1 to the time t2. The number of times that a touched screen detection operation is performed in the touched screen detection mode TSDM may be 3 or more.

The first and second touched screen detection operations TSD1 and TSD2 and the first to third display operations DP21 to DP23 are performed such that each of time periods for the first and second touched screen detection operations TSD1 and TSD2 does not overlap time periods for the first to third display operations DP21 to DP23.

In the second touched screen detection operation TSD2, for example, when a touch to the first screen DP1 is detected, the touch panel TP switches the display to normally display an image as viewed from the display screen on which the touch has been detected, and transitions to the normal touch detection mode TPDM after the time t2. On the other hand, when the touch to the first screen DP1 is detected, the display panel PNL switches the display on the second screen DP2 side to the display on the first screen DP1 side while keeping the display state (display on) after the time t2. Other configurations and operations illustrated in FIG. 17 are the same as the configurations and operations illustrated in FIG. 16 and duplicate description is omitted.

Configuration Example of Control Signal of Display Device

Figure 18:
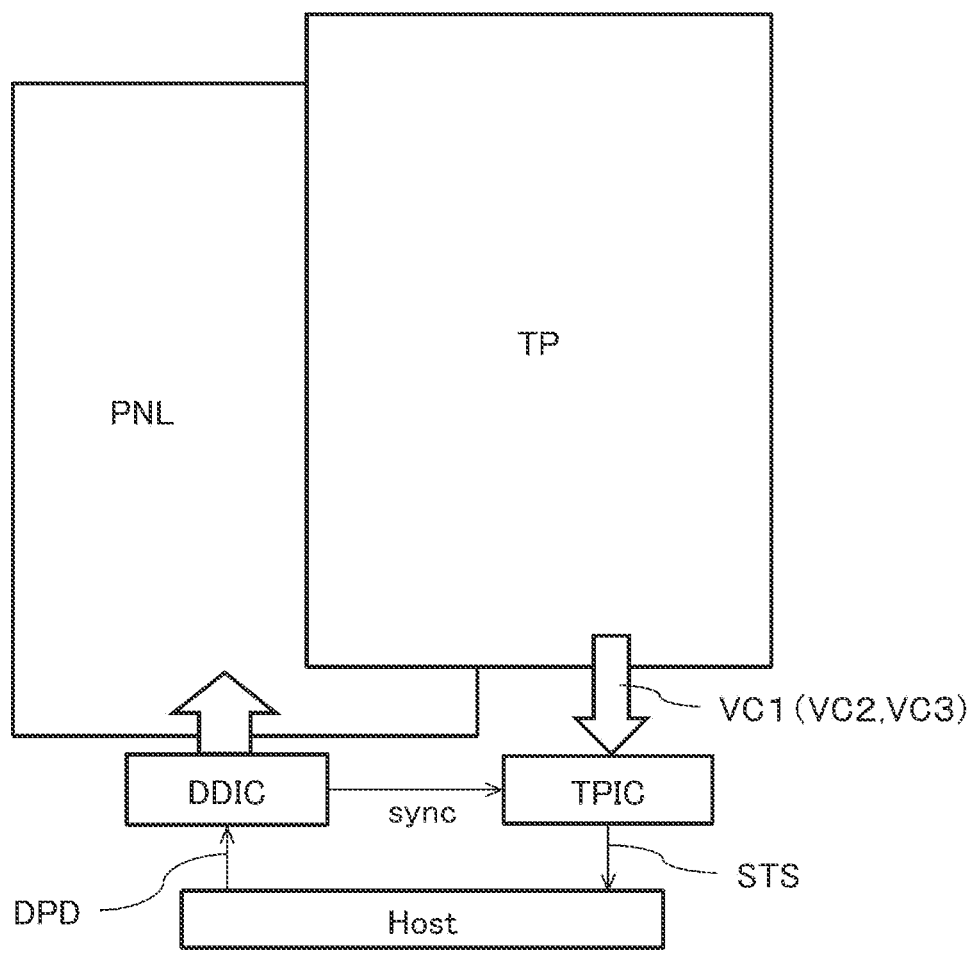
FIG. 18 is a diagram describing a configuration example of a control signal of the display device according to the embodiment.

FIG. 18 is a diagram describing a configuration example of a control signal of the display device according to the embodiment. FIG. 18 schematically illustrates a host device Host, and the display panel PNL, the touch panel TP, the display drive IC chip DDIC, and the touch sensor IC chip TPIC that are included in the display device DSP illustrated in FIG. 1. In FIG. 18, the display panel PNL and the touch panel TP are illustrated by shifting the display panel PNL and the touch panel TP in a plane to easily understand the display panel PNL and the touch panel TP. It is assumed that the touch sensor IC chip TPIC operates in synchronization with the display drive IC chip DDIC based on a synchronization signal sync received from the display drive IC chip DDIC. An example of a configuration for generating display data corresponding to a touched screen determined by the host device Host and transmitting the display data to the display panel is described with reference to FIG. 18.

The touch sensor IC chip TPIC acquires, from the touch panel TP, a detected value VC1 (or VC2, VC3, or the like) as change data of a capacitance value regarding the touched screen. The touch sensor IC chip TPIC determines the touched screen based on the detected value VC1 (or VC2, VC3, or the like). The detection method described with reference to FIG. 8 and the third to fifth modifications can be used for the determination of the touched screen.

The touch sensor IC chip TPIC transmits, to the host device Host, a signal STS indicating the result of determining the touched screen (or the result of confirming the determination). The host device Host receives the signal STS and generates display data DPD corresponding to the determined touched screen based on the signal STS.

When the signal STS indicates that the first screen DP1 is a touched screen, the host device Host generates display data DPD that will be displayed correctly when viewed from the first screen DP1 side, and transmits the generated display data DPD to the display drive IC chip DDIC. When the signal STS indicates that the second screen DP2 is a touched screen, the host device Host generates display data DPD that will be displayed correctly when viewed from the second screen DP2 side, and transmits the generated display data DPD to the display drive IC chip DDIC. When the signal STS indicates that the first screen DP1 and the second screen DP2 are touched screens, the host device Host does not generate display data DPD or the like and performs control to keep the previous display screen.

The display drive IC chip DDIC receives the display data DPD and causes the display panel PNL to perform a display operation based on the display data DPD.

When the display drive IC chip DDIC has an inversion display function, the host device Host does not generate display data DPD and generates a control signal (command or instruction) to switch on or off the inversion display function of the display drive IC chip DDIC based on the signal STS indicating the result of determining the touched screen (or the result of confirming the determination) and transmits the control signal to the display drive IC chip DDIC.

Modifications of Entire Configuration of Display Device

Next, some modifications of the entire configuration of the display device are described. Although FIG. 1 illustrates the example of the configuration of the display device DSP in which the display drive IC chip DDIC is mounted on the mounting portion MA1 of the display panel PNL and the touch sensor IC chip TPIC is mounted on the flexible printed circuit board FPC2, the display device DSP is not limited thereto. The display device DSP may have any of configurations according to the following sixth to ninth modifications. In the sixth to ninth modifications, the display panel PNL and the touch panel TP are illustrated by shifting the display panel PNL and the touch panel TP in a plane to easily understand the display panel PNL and the touch panel TP.

Sixth Modification

Figure 19:
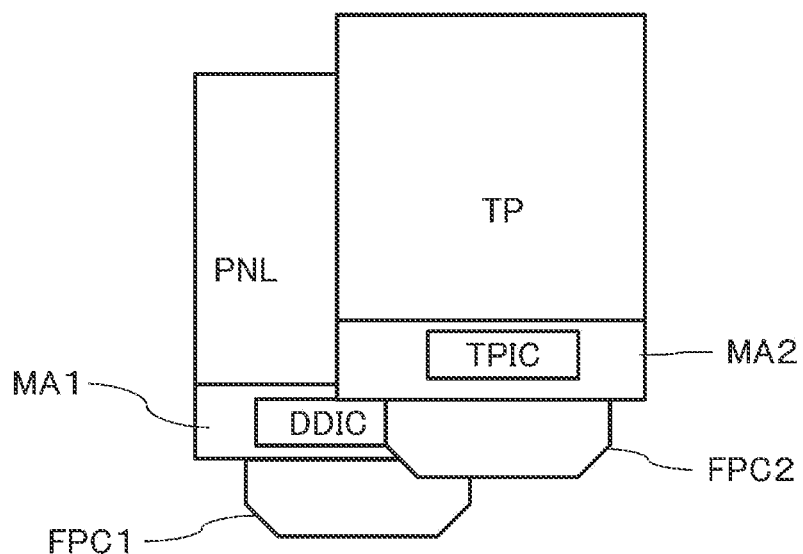
FIG. 19 is a diagram illustrating a configuration example of a display device according to a sixth modification.

FIG. 19 is a diagram illustrating a configuration example of a display device according to the sixth modification. In the display device DSPb according to the sixth modification, the display drive IC chip DDIC is mounted on the mounting portion MA1 of the display panel PNL and the touch sensor IC chip TPIC is mounted on the mounting portion MA2 of the touch panel TP.

Seventh Modification

Figure 20:
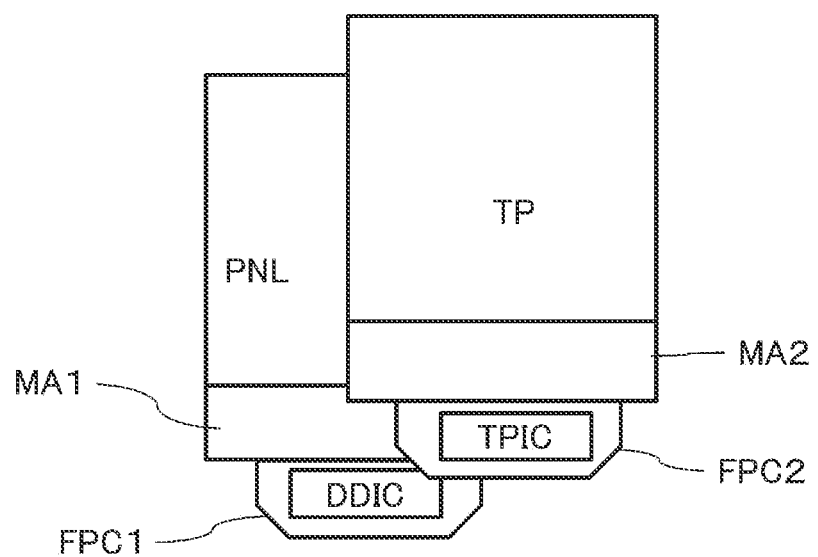
FIG. 20 is a diagram illustrating a configuration example of a display device according to a seventh modification.

FIG. 20 is a diagram illustrating a configuration example of a display device according to the seventh modification. In the display device DSPc according to the seventh modification, the display drive IC chip DDIC is mounted on the flexible printed circuit board FPC1 and the touch sensor IC chip TPIC is mounted on the flexible printed circuit board FPC2.

Eighth Modification

Figure 21:
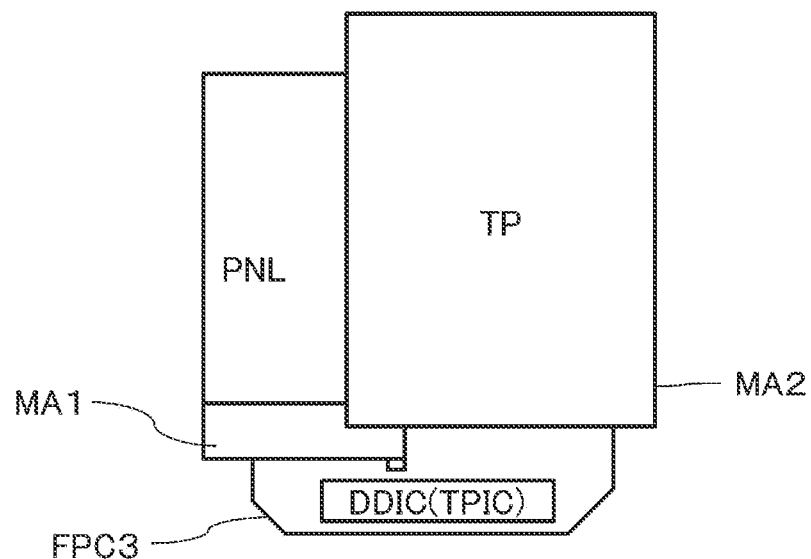
FIG. 21 is a diagram illustrating a configuration example of a display device according to an eighth modification.

FIG. 21 is a diagram illustrating a configuration example of a display device according to the eighth modification. In the display device DSPd according to the eighth modification, the display drive IC chip DDIC and the touch sensor IC chip TPIC are constituted by a single semiconductor chip DDIC (TPIC), and the semiconductor DDIC (TPIC) is mounted on a flexible printed circuit board FPC3. The flexible printed circuit board FPC3 is branched into two portions. One of the portions of the flexible printed circuit board FPC3 is connected to the mounting portion MA1 of the display panel PNL, and the other of the portions of the flexible printed circuit board FPC3 is connected to the mounting portion MA2 of the touch panel TP.

Ninth Modification

Figure 22:
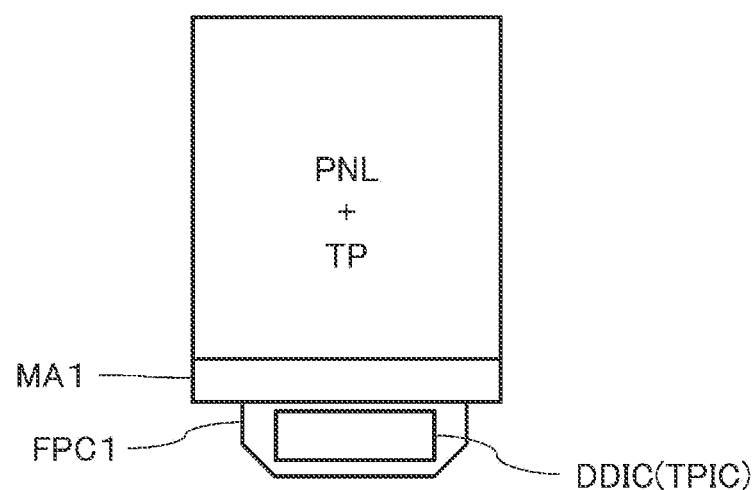
FIG. 22 is a diagram illustrating a configuration example of a display device according to a ninth modification.

FIG. 22 is a diagram illustrating a configuration example of a display device according to the ninth modification. In the display device DSPe according to the ninth modification, the functions of the touch panel TP are embedded in the display panel PNL, and the display drive IC chip DDIC and the touch sensor IC chip TPIC are constituted by a single semiconductor chip DDIC (TPIC). The flexible printed circuit board FPC1 is connected to the mounting portion MA1 of the display panel (PNL+TP), and the semiconductor chip DDIC (TPIC) is mounted on the flexible printed circuit board FPC1.

Tenth Modification

Figure 23:
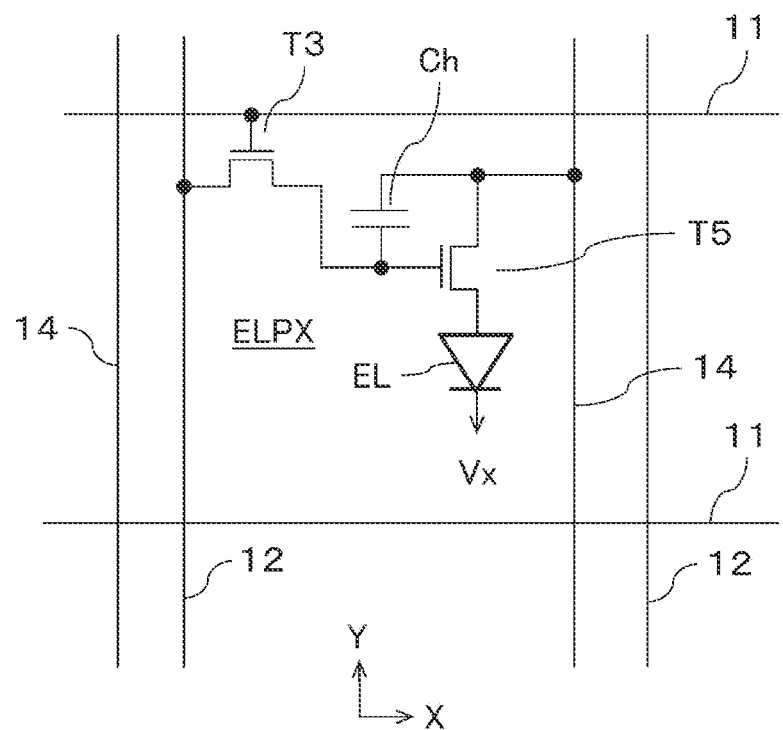
FIG. 23 is a diagram illustrating an equivalent circuit of a pixel portion of a display region of an organic EL display panel according to a tenth modification.

Each of FIGS. 1 to 3 illustrates the configuration of the display panel PNL in which polymer dispersed liquid crystal (PDLC) or the like is used as the liquid crystal layer LC, but the display panel PNL is not limited thereto. The display panel PNL may be an organic EL display panel EPNL with an organic EL layer. FIG. 23 illustrates an equivalent circuit of a pixel portion of a display region of the organic EL display panel according to the tenth modification.

In FIG. 23, image signal lines (source lines) 12 and power supply lines 14 extend in the second direction Y and are arrayed in the first direction X. Scan lines (gate lines) 11 extend in the first direction X and are arrayed in the second direction Y. A region surrounded by the image signal lines 12 or the power supply lines 14 and the scan lines 11 is a pixel ELPX. A plurality of pixels ELPX are disposed in the organic EL display panel. The plurality of pixels ELPX are arranged in a matrix form in the first direction X and the second direction Y. Each of the pixels ELPX has an organic EL layer (EL) constituting an organic light emitting diode (OLED).

In FIG. 23, a current that flows in the organic EL layer (EL) as a light emitting layer is controlled by a control TFT (T5). The drain of the control TFT (T5) is electrically connected to the power supply line 14, and a storage capacitor (Ch) is electrically connected between the power supply line 14 and the gate of the control TFT (T5). In addition, the gate of the control TFT (T5) is electrically connected to the source of a switching TFT (T3). The drain of the switching TFT (T3) is electrically connected to the image signal line 12.

In FIG. 23, when the gate of the switching TFT (T3) is in an ON state, an image signal from the image signal line 12 is supplied to one electrode of the storage capacitor Ch, and an electric charge corresponding to the image signal is supplied from the power supply line 14 to the storage capacitor Ch. As a result, the gate of the control TFT (T5) is kept at a predetermined potential, a current corresponding to the predetermined potential flows in the organic EL layer (EL) via the control TFT (T5), and the organic EL layer (EL) emits light.

Eleventh Modification

Figure 24:
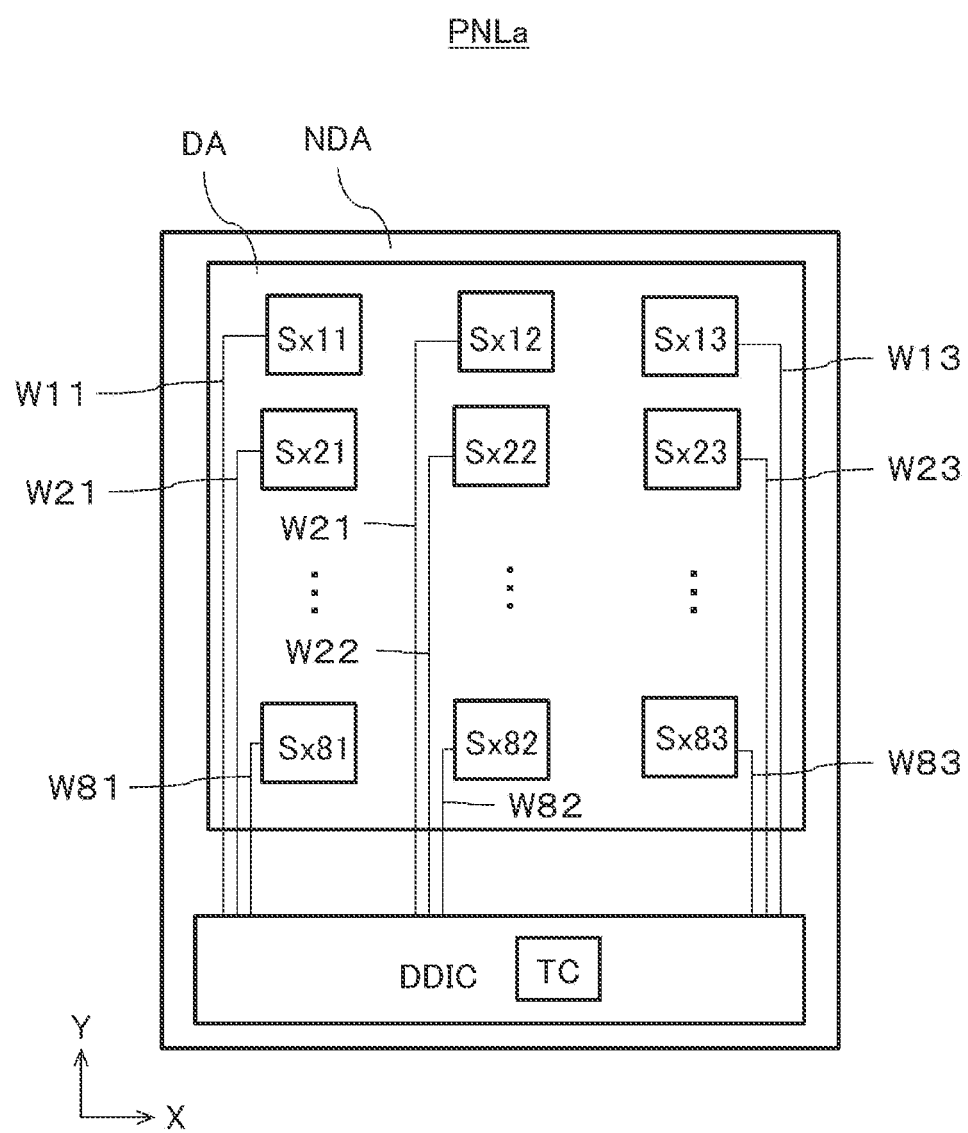
FIG. 24 is a diagram illustrating a configuration example of a display device according to an eleventh modification.

FIG. 24 is a schematic plan view illustrating a configuration example of a display panel according to the eleventh modification. The display panel PNLa illustrated in FIG. 24 can detect a touched screen by the self-detection method in the touched screen detection mode (mode1) and the normal touch detection mode (mode2).

A plurality of electrodes Sx11, Sx12, Sx13, Sx21, Sx22, Sx23, . . . , Sx81, Sx82, and Sx83 for a sensor are formed as individual electrodes and arranged in a matrix form on a display region DA. The plurality of electrodes Sx11 to Sx83 for the sensor function as a common electrode CE for display in an image display period and has the functions of the drive electrodes and the detection electrodes for the self-detection method in touch detection periods in the touched screen detection mode (mode1) and the normal touch detection mode (mode2). The electrodes Sx11 to Sx83 for the sensor are described below as detection electrodes.

A plurality of pixels PX are formed facing the detection electrodes Sx11 to Sx83. The detection electrodes Sx11 to Sx83 are connected to the display drive IC chip DDIC via a plurality of leading wirings W11, W12, W13, W21, W22, W23, . . . , W81, W82, and W83. Each of the detection electrodes Sx11 to Sx83 is sequentially driven (scanned) based on a self-detection drive pulse from the voltage supply unit CD in accordance with an instruction from the display drive IC chip DDIC in a touch detection period. A detection signal from each of the detection electrodes Sx11 to Sx83 is supplied to a touch detection circuit TC disposed in the display drive IC chip DDIC via the leading wirings W11, W12, W13, W21, W22, W23, . . . , W81, W82, and W83, and whether a touched screen is the first screen or the second screen can be immediately detected and the position of a touched portion can be found. On the other hand, in an image display period, the detection electrodes Sx11 to Sx83 function as the common electrode CE and a predetermined voltage (VCOM) is supplied from the voltage supply unit CD to the detection electrodes Sx11 to Sx83.

According to the eleventh modification, since a touched screen can be detected by the self-detection method in the touched screen detection mode and the normal touch detection mode, it is possible to simplify the configuration of the display panel PNLa. In addition, it is also possible to simplify the configuration of the display drive IC DDIC.

Twelfth Modification

The touch panel TP may have the plurality of electrodes Sx11 to Sx83 for the sensor as illustrated in FIG. 24. That is, the drive electrodes Tx and the detection electrodes Rx of the touch panel TP illustrated in FIGS. 1 and 2A may be replaced with the plurality of electrodes Sx11 to Sx83 for the sensor that are illustrated in FIG. 24.

All display devices that can be appropriately designed and implemented by those skilled in the art based on the display device described above as the embodiment of the present invention also belong to the scope of the present invention as long as the display devices belong to the scope of the present invention.

In the scope of the idea of the present invention, those skilled in the art can conceive of various modified examples and corrected examples, and it is understood that these modified examples and corrected examples also belong to the scope of the present invention. For example, additions, deletions, or design changes of components, or additions, omissions, or condition changes of processes by those skilled in the art with respect to the embodiment and each modification described above are included in the scope of the present invention as long as the additions, deletions, or design changes of the components, or the additions, omissions, or condition changes of the processes do not deviate from the gist of the present invention.

In addition, other effects obtained from the aspects described in the embodiment and clearly understood from the description of the present specification, or effects that can be appropriately conceived by those skilled in the art are understood to be obtained from the present invention.

Various inventions can be formed by an appropriate combination of two or more of the components disclosed in the above embodiment. For example, some components may be removed from all the components described in the embodiment. Furthermore, two or more of the components described in the embodiment and the modifications may be combined as needed.

REFERENCE SIGNS LIST

DSP: display panel
PNL: display panel
TP: touch panel
DP1: first screen
DP2: second screen
Rx: detection electrode
Tx: drive electrode
EPNL: organic EL display panel

What is claimed is:

1. A display device comprising:
   a detection electrode;
   a first screen;
   a second screen on a side opposite to the first screen; and
   a controller,
   wherein the controller includes, as thresholds for a detected value from the detection electrode, a first threshold, a second threshold larger than the first threshold, and a third threshold larger than the second threshold,
   when the detected value is in a first range between the first threshold and the second threshold, the controller determines that the first screen has been touched,
   when the detected value is in a second range between the second threshold and the third threshold, the controller determines that the second screen has been touched,
   when the detected value is in a third range equal to or larger than the third threshold, the controller determines that the first screen and the second screen have been touched, and
   wherein the controller makes the determination when the detected value is continuously in the first range, the second range, or the third range for a predetermined number of consecutive frames or more,
   wherein a distance between the detection electrode and the first screen is longer than a distance between the detection electrode and the second screen, or
   a dielectric constant between the detection electrode and the first screen is lower than a dielectric constant between the detection electrode and the second screen, or
   the distance between the detection electrode and the first screen is longer than the distance between the detection electrode and the second screen, and the dielectric constant between the detection electrode and the first screen is lower than the dielectric constant between the detection electrode and the second screen.

2. The display device according to claim 1, wherein the controller makes the determination when a portion having a predetermined area or more has been touched.

3. The display device according to claim 1,
wherein when the controller determines that the first screen has been touched, the controller performs display on the first screen side,
when the controller determines that the second screen has been touched, the controller performs display on the second screen side, and
when the controller determines that the first screen and the second screen have been touched, the controller keeps a displayed screen.

4. The display device according to claim 3, further comprising a transparent display having the first screen and the second screen.

5. The display device according to claim 1, further comprising a transparent display having the first screen and the second screen.

6. The display device according to claim 5, wherein the transparent display includes a polymer dispersed liquid crystal (PDLC).

7. The display device according to claim 5, wherein the transparent display includes an organic light emitting diode (OLED).

8. The display device according to claim 1, further comprising a transparent display having the first screen and the second screen.

* * * * *